(12) United States Patent
Venigalla et al.

(10) Patent No.: US 10,832,971 B2
(45) Date of Patent: Nov. 10, 2020

(54) FABRICATING TAPERED SEMICONDUCTOR DEVICES

(71) Applicant: International Business Machines Corporation, Armonk, NY (US)

(72) Inventors: Rajasekhar Venigalla, Boise, ID (US); Ravikumar Ramachandran, Pleasantville, NY (US); Albert Chu, Nashua, NH (US); Alan Thomas, Hopewell Junction, NY (US); Kafai Lai, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/117,258

(22) Filed: Aug. 30, 2018

(65) Prior Publication Data
US 2020/0075428 A1 Mar. 5, 2020

(51) Int. Cl.
*H01L 21/8234* (2006.01)
*H01L 21/8238* (2006.01)
*H01L 27/092* (2006.01)
*H01L 21/3213* (2006.01)
*H01L 21/308* (2006.01)

(52) U.S. Cl.
CPC ........... *H01L 21/823821* (2013.01); *H01L 21/82385* (2013.01); *H01L 21/823878* (2013.01); *H01L 21/3083* (2013.01); *H01L 21/32139* (2013.01); *H01L 27/0924* (2013.01)

(58) Field of Classification Search
CPC .......... H01L 21/308; H01L 21/823431; H01L 21/823821; H01L 29/66795; H01L 29/785
See application file for complete search history.

(56) References Cited

U.S. PATENT DOCUMENTS

| | | | |
|---|---|---|---|
| 8,546,891 B2 * | 10/2013 | Chang | H01L 29/06 257/401 |
| 8,658,536 B1 | 2/2014 | Choi et al. | |
| 9,018,084 B2 | 4/2015 | Chang et al. | |
| 9,147,730 B2 | 9/2015 | Xie et al. | |
| 9,337,050 B1 | 5/2016 | Xie et al. | |
| 9,425,106 B1 | 8/2016 | Xie et al. | |
| 9,659,785 B2 | 5/2017 | Cheng et al. | |
| 9,722,024 B1 | 8/2017 | Xie et al. | |
| 9,779,960 B2 | 10/2017 | Xie et al. | |
| 2016/0233246 A1 | 8/2016 | Anderson et al. | |

* cited by examiner

*Primary Examiner* — Mark V Prenty
(74) *Attorney, Agent, or Firm* — Fleit Intellectual Property Law; Thomas S. Grzesik

(57) ABSTRACT

A semiconductor structure and a method for fabricating the same. The semiconductor structure includes a gate cut mask having one cut window exposing one or more portions of multiple sacrificial gate structures of the at least one plurality of sacrificial gate structures. The multiple sacrificial gate structures having been formed over portions of in structures. The method comprises forming a gate cut mask a plurality of semiconductor fins and a plurality of sacrificial gate structures. The gate cut mask being formed with one cut window exposing one or more portions of multiple sacrificial gate structures of the plurality of sacrificial gate structures. At least the portion of multiple sacrificial gate structures and one or more portions of each semiconductor fin of the plurality of semiconductor fins underlying the one or more portions of one of the multiple sacrificial gate structures are removed.

20 Claims, 20 Drawing Sheets

US 10,832,971 B2

FABRICATING TAPERED SEMICONDUCTOR DEVICES

BACKGROUND OF THE INVENTION

The present disclosure generally relates to the field of semiconductors, and more particularly relates to fabricating tapered semiconductor devices.

The MOSFET is a transistor having a source, a drain, and a metal oxide gate electrode. The metal gate is electrically insulated from the main semiconductor n-channel or p-channel by a thin layer of insulating material, for example, silicon dioxide, which makes the input resistance of the MOSFET relatively high. The gate voltage controls whether the path from drain to source is an open circuit ("off") or a resistive path ("on").

The finFET is a type of MOSFET. The finFET is generally a double-gate/tri-gate silicon-on-insulator (SOI) or bulk fin device that mitigates the effects of short channel and reduces drain-induced barrier lowering. The "fin" refers to the narrow channel between source and drain regions. A thin insulating oxide layer on either side of the fin typically separates the fin from the gate. Multiple finFET devices may be combined when fabricating an integrated circuit. In some instances, multiple finFET devices may have a different number of fins defining the active region. For example, a first finFET devices may have three fins while a second finFET device may have two fins. The difference in number of fins results in the active region being non-rectangular. This arrangement is referred to as a tapered device since the active region comprises a taper where the difference in number of fins or fin length occurs, especially when the transition from three to two fin devices happens within a few gate pitches. Higher density layouts can be achieved by using tapered devices since a separate active region with a rectangular shape does not need to be formed for each device.

SUMMARY OF THE INVENTION

In one embodiment, a method for forming tapered semiconductor devices is disclosed. The method comprises at least the following operations. A plurality of semiconductor fins is formed on a substrate. A plurality of sacrificial gate structures is formed, where each sacrificial gate structure is formed over and in contact with each of the semiconductor fins. A gate cut mask is formed over the plurality of semiconductor fins and the plurality of sacrificial gate structures. The gate cut mask being formed with a plurality of cut windows where each cut window exposes a portion of a single sacrificial gate structure of the plurality of sacrificial gate structures. The portion of each single sacrificial gate structure exposed by each cut window, and a portion of each semiconductor fin of the plurality of semiconductor fins underlying the portion of each single sacrificial gate structure are removed.

In another embodiment, a method for forming tapered semiconductor devices is disclosed. The method comprises at least the following operations. A plurality of semiconductor fins is formed on a substrate. A plurality of sacrificial gate structures is formed. Each sacrificial gate structure is formed over and in contact with each of the plurality of semiconductor fins. A gate cut mask is formed over the plurality of semiconductor fins and the plurality of sacrificial gate structures. The gate cut mask being formed with one cut window exposing one or more portions of multiple sacrificial gate structures of the plurality of sacrificial gate structures. At least the portion of multiple sacrificial gate structures and one or more portions of each semiconductor fin of the plurality of semiconductor fins underlying the one or more portions of one of the multiple sacrificial gate structures are removed.

In another embodiment, a semiconductor structure is disclosed. The semiconductor structure comprises at least the following components. A substrate and at least one plurality of semiconductor fins formed on the substrate. At least one plurality of sacrificial gate structures, where each sacrificial gate structure of the at least one plurality of sacrificial gate structures is formed over and in contact with each semiconductor fin of the at least one plurality of semiconductor fins. A gate cut mask is formed over the at least one plurality of semiconductor fins and the at least one plurality of sacrificial gate structures. The gate cut mask comprises one cut window exposing one or more portions of multiple sacrificial gate structures of the at least one plurality of sacrificial gate structures.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
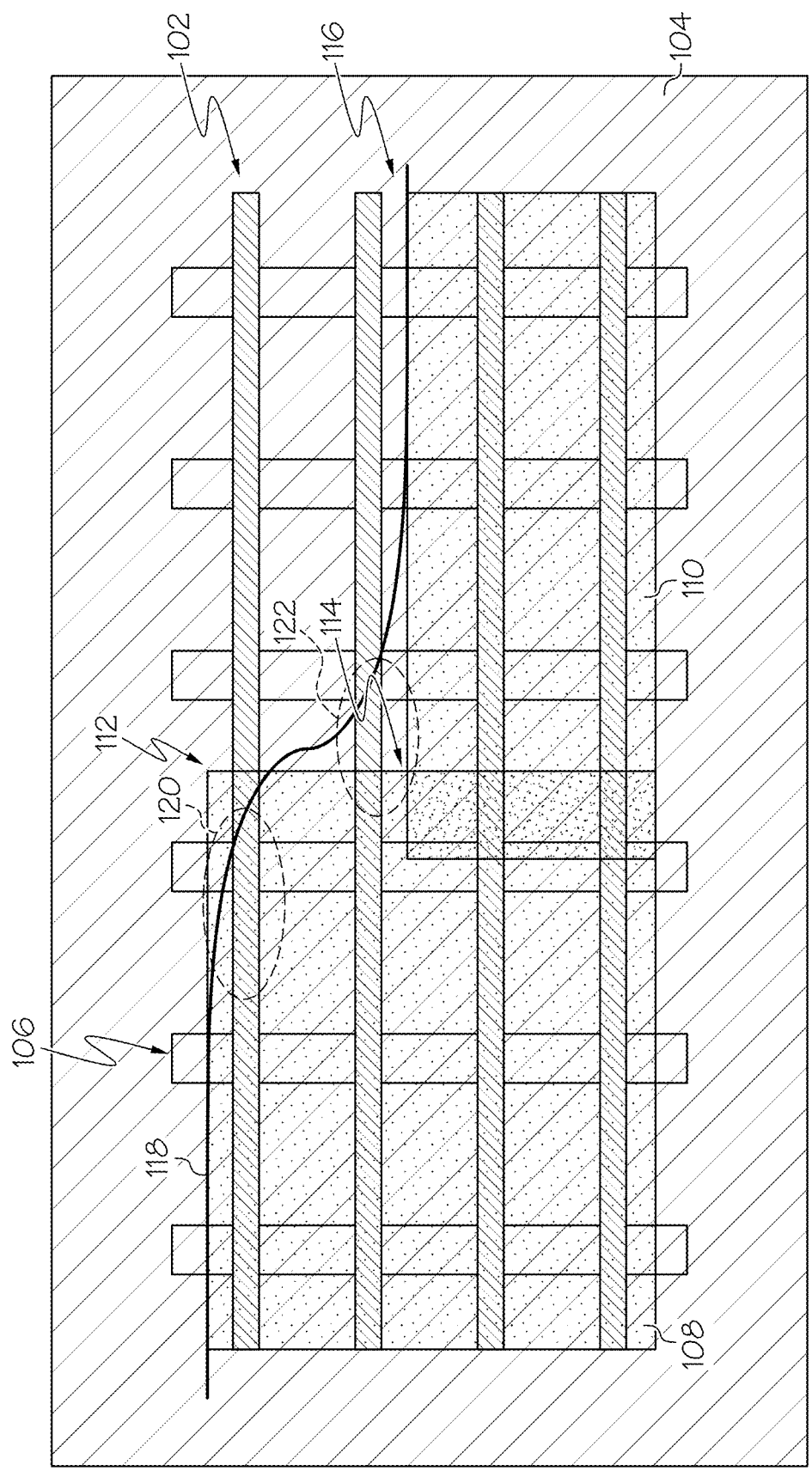
FIG. 1 is a top view of a semiconductor structure illustrating the effects of corner rounding on fin cut masks.

It is to be understood that the present disclosure will be described in terms of a given illustrative architecture; however, other architectures, structures, substrate materials and process features and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present disclosure may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Tapered devices allow for higher density layouts since a separate active region with a rectangular shape does need to be formed for each device. Conventional techniques for fabricating tapered devices generally utilize active area masks to define tapered devices on the wafer. However, accurately forming the active area masks for defining tapered devices becomes more difficult as the fin pitch becomes smaller. As the critical dimensions of the desired pattern shrink the consistency between the masked and actual layout pattern developed in the photoresist over the fins is significantly reduced. For example, proximity effects in a lithographic process can arise during exposure, resist pattern formation, and subsequent pattern transfer steps such as etching. The proximity effect causes corner rounding, where substantially square corners of a pattern are rounded.

Optical proximity effects such as corner rounding are problematic for active area masks, especially as the pitch between fins decreases. For example, corner rounding can move the edge of an active area mask, away from target locations and cause inclusion of an additional semiconductor fin(s); unwanted removal of a semiconductor fin(s); expansion of device widths; etc. In addition, corner rounding may also result in the ends of fins having the incorrect length or being non-uniform, shortening of the channel region, etc.

Consider the example shown in FIG. 1, where a plurality of fins 102 is formed on a substrate 104. Outlines of gates 106 are shown to illustrate the locations where physical gates would be formed in subsequent processing steps. In this example, multiple active area mask layout designs 108, 110 are shown as being disposed over portions of the structure. The layout designs show the ideal shape of the desired masks prior to lithographic processing, and are shown as being transparent for illustration purposes only. As shown in FIG. 1, the active area mask layouts 108, 110 have substantially square corners 112, 114, 116. However, due to lithographic proximity effects one or more of the substantially square corners 112, 114 will become rounded as illustrated by line 118. As can be seen, instead of the active area masks having the substantially rectangular corners of the active area mask layout designs 108, 110 the fabricated active area masks will have contoured (e.g., rounded) corners. Because of the small pitch between fins 102, the tolerance for active area corner rounding is low. Therefore, when the active area mask pattern is transferred to the device incomplete fins (parasitic fins) will be formed at the rounded corners areas 120, 122 and eventually under a gate. The above side effects of corner rounding may cause layout errors and device performance issues such as short-circuits, open-circuits, device performance drift, etc., which in turn significantly impact device performance, quality, and reliability.

Embodiments of the present invention overcome the above problems by defining tapered devices as part of a sacrificial gate cut process instead of the active area cut process. During the gate cut process of one or more embodiments, not only are portions of sacrificial gates removed but also their underlying fins to define the tapered devices. Defining tapered devices during the gate cut process is advantageous because the pitch between gates is larger than the pitch between fins. Therefore, any adverse effects resulting from corner rounding of the gate mask are mitigated or eliminated. In addition, one or more gate cut shapes and of at least one embodiment is free of corner rounding. Also, the process tolerances requirement can be improved with advanced lithographic techniques such as extreme ultraviolet (EUV) light lithography. Improved tolerances can improve the manufacturability for defining these tapered device structures.

Figure 2:
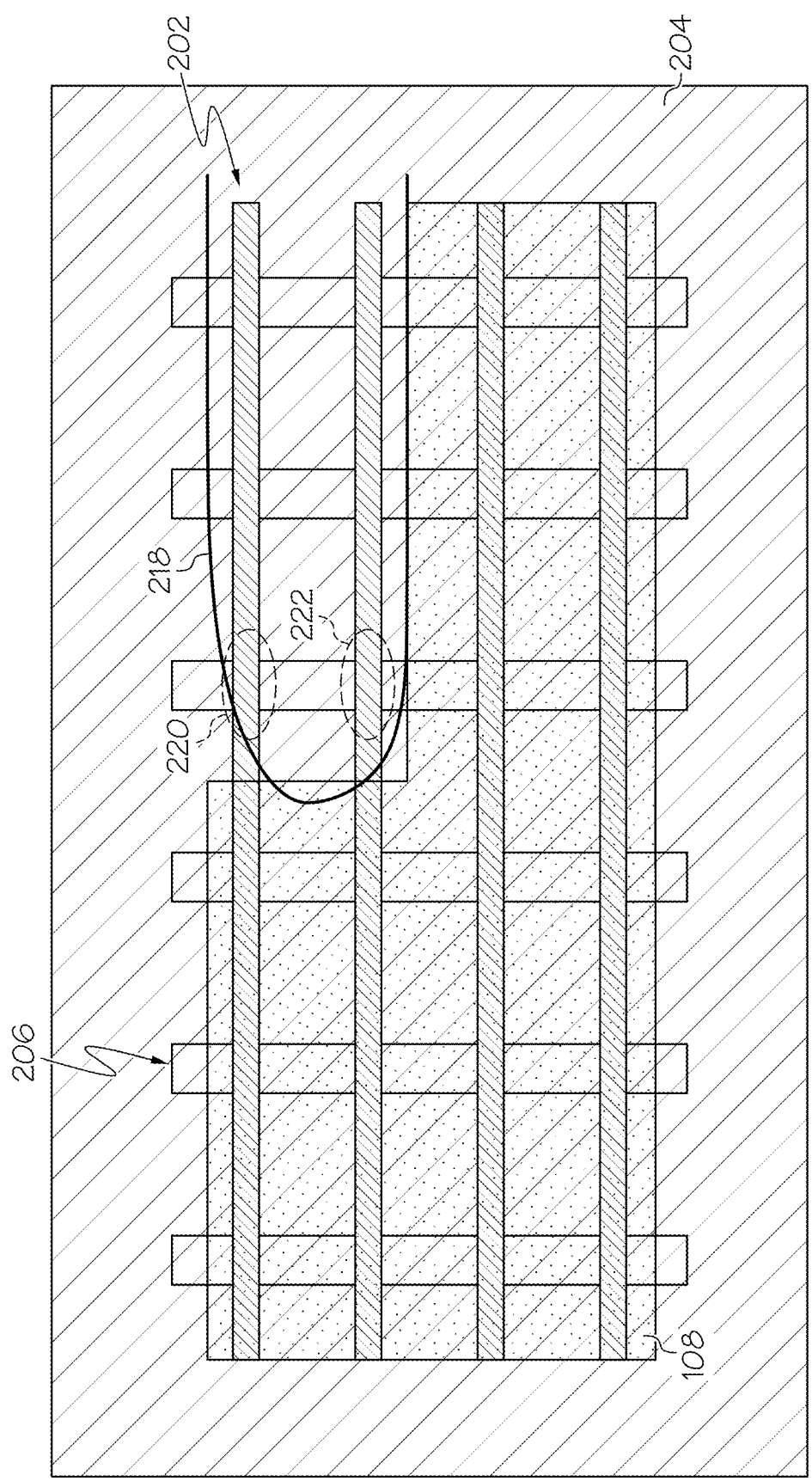
FIG. 2 is a top view of a semiconductor structure illustrating the advantages of utilizing gate cut masks with respect to corner rounding effects to define tapered devices according to according one embodiment of the present disclosure.

Consider the example shown in FIG. 2 where a plurality of fins 202 is formed on a substrate 204 similar to FIG. 1. Instead of utilizing active area masks to cut fins for defining tapered devices, one or more embodiments utilize gate cut mask. Therefore, the gate outlines 206 correspond to sacrificial gates formed over the plurality of fins 202, and the mask layout design 208 is a gate cut mask layout design. Line 218 shows that even if corner rounding occurs during the gate cut mask lithography progress that adverse effects of corner rounding are mitigated because even though incomplete fins will be formed in areas 220, 222 they will not be connected to a gate. Another advantage of one or more embodiments is that unwanted topography is not introduced during the gate area cutting process. For example, during an active area cut process topography may be instructed through the loss of the fin and the immediately surrounding local isolation dielectric. However, because embodiments of the present invention cut fins using a gate cut mask the fins are originally preserved at the time of sacrificial gate deposition, and hence the unwanted topography is non-existent.

FIGS. 3-13 illustrate various processes for fabricating tapered semiconductor devices. In general, the figures comprise a top view, while some figures show various cross-sectional views that are taken transverse to the long axis of the fins. It should be noted that one or more embodiments are not limited to the processes discussed below for forming the initial fin structures and sacrificial (dummy) gate structures, and completing the device(s). This discussion is provided for illustration purposes, and any applicable process for fabricating the initial fin structures and sacrificial (dummy) gate structures, and completing the device(s) may be utilized by embodiments of the present invention. In addition, one or more embodiments may be utilized for other high-K metal gate (HKMG) gate architectures.

Figure 3:
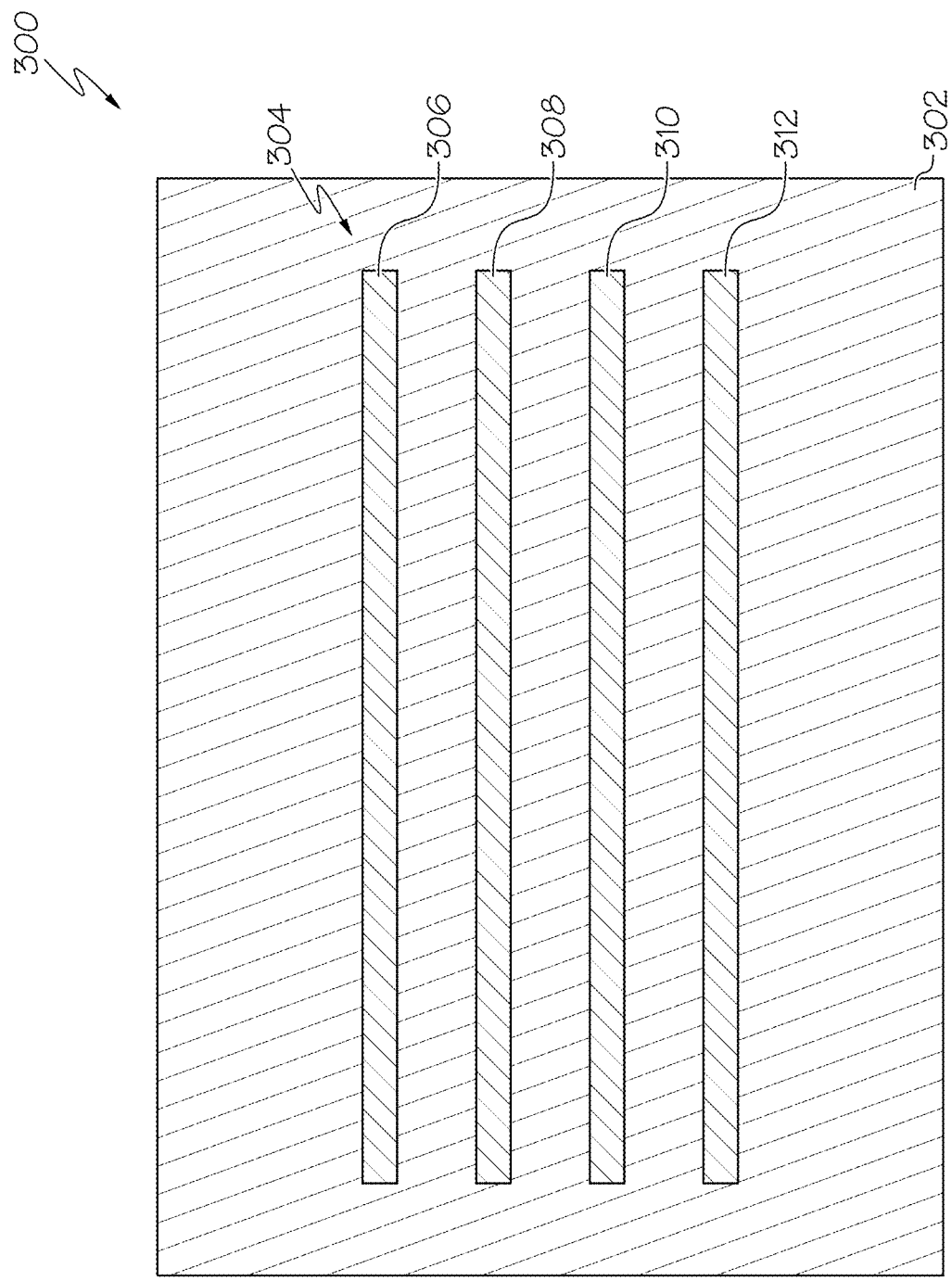
FIG. 3 is a top view of a semiconductor structure after fin structures have been formed on a substrate according one embodiment of the present disclosure.

FIG. 3 shows a semiconductor structure 300 at a given point in the fabrication process. For example, FIG. 3 shows a substrate 302 and a plurality 304 of fin structures 306 to 312 having been formed thereon. In some embodiments, a hard mask (not shown) may be formed on and in contact with a top surface of each fin structure 306 to 312. The structure 300 may comprise fins for pFET devices, nFET devices, or a combination of both. In some embodiments, the substrate 302 is a bulk substrate and is entirely comprised of a semiconductor material. The substrate 302 may comprise a single crystalline semiconductor material or a polycrystalline material. In another embodiment, the substrate 302 may include an elemental semiconductor material such as silicon (Si) or germanium (Ge), a semiconductor material primarily composed of Group IV elements such as a silicon-germanium alloy or a silicon-carbon alloy, a III-V compound semiconductor material, a II-VI compound semiconductor material, or an organic semiconductor material.

The substrate 302 may comprise undoped single crystalline silicon or single crystalline silicon doped with p-type dopant atoms or n-type dopant atoms. Examples of materials for the substrate 302 include, but are not limited to, silicon, germanium, diamond, silicon germanium, silicon carbide, gallium arsenic, indium arsenide, indium phosphide, silicon germanium carbide, gallium arsenic phosphide, gallium indium phosphide, combinations of these, or any other suitable semiconductor material(s) in which fins for multi-gate devices can be formed. In other embodiments, the substrate 302 is formed on and in contact with a handle substrate or an insulating layer disposed in contact with a handle substrate. In this embodiment, the handle substrate includes similar materials to those discussed above.

Doping of the substrate 302 (or other semiconductor layer from which the fins 306 to 312 are formed) may be performed using, for example, ion implantation, or annealing if not using an epitaxial process. In a non-limiting illustrative example, the doping utilizes, for example, arsenic (As) or phosphorous (P) for n-type device, and boron (B) for a p-type device.

In other embodiments, the substrate 302 is a silicon-on-insulator (SOI) substrate. In this example, an optional dielectric layer (e.g., a BOX layer or oxide layer) overlies the substrate, and the fin structures 306 to 312 are formed on and in contact with the dielectric layer. The optional dielectric layer may be formed from any of several dielectric materials. Non-limiting examples include, for example, oxides, nitrides, and oxynitrides of silicon. The dielectric layer may also include oxides, nitrides, and oxynitrides of elements other than silicon. In addition, the dielectric layer may include crystalline or non-crystalline dielectric material. Moreover, the dielectric layer may be formed using any of several methods. Non-limiting examples include ion implantation methods, thermal or plasma oxidation or nitridation methods, chemical vapor deposition methods and physical vapor deposition methods. The dielectric layer may include a thickness ranging from about 5 nm to about 200 nm. In one embodiment, the dielectric layer may be about 25 nm thick. In an embodiment where the fins structures are formed on an SOI substrate, the fin structures and the substrate can be made of the same or different materials.

In an SOI embodiment, the semiconductor material/layer from which the fin structures 306 to 312 are fabricated may be formed utilizing various methods such as a layer transfer process including a bonding step, or an implantation process such as SIMOX (Separation by IMplantation of OXygen). This semiconductor material/layer may be undoped or doped with either p-type or n-type dopants through ion implantation, plasma doping, or gas phase doping. P-type transistors are produced by doping the semiconductor material/layer with elements from group III of the periodic table (e.g., boron, aluminum, gallium, or indium). As an example, the dopant can be boron in a concentration ranging from $1 \times 10E18$ atoms/cm3 to $2 \times 10E21$ atoms/cm3. N-type transistors are produced by doping the semiconductor material/layer with elements from group V of the periodic table (e.g., phosphorus, antimony, or arsenic).

The fin structures 306 to 312 may be formed by forming an etch-stop hard mask onto the substrate 302 (or separate semiconductor layer) through, for example, deposition. The etch-stop hard mask may be made of, for example, silicon oxide, silicon oxynitride, silicon carbide, silicon oxycarbide, silicon nitride, titanium nitride, tetraethyl orthosilicate, a combination thereof, and/or other materials suitable in providing etch-stop function. The fin structures 306 to 312 are subsequently formed or etched out of the substrate 302 (or another semiconductor layer) through a process involving masking, using industry-standard lithographic techniques, and directionally etching (e.g., RIE) the etch-stop capping layer and underneath semiconductor layer (or substrate 104). After the RIE etching process, the photo-resist mask used in the lithographic etching process may be removed, leaving the fin structures 306 to 312 and optional hard masks (not shown). In some embodiments, there may be different pitches between two or more of the fin structures 306 to 312 to define different devices.

Figure 4:
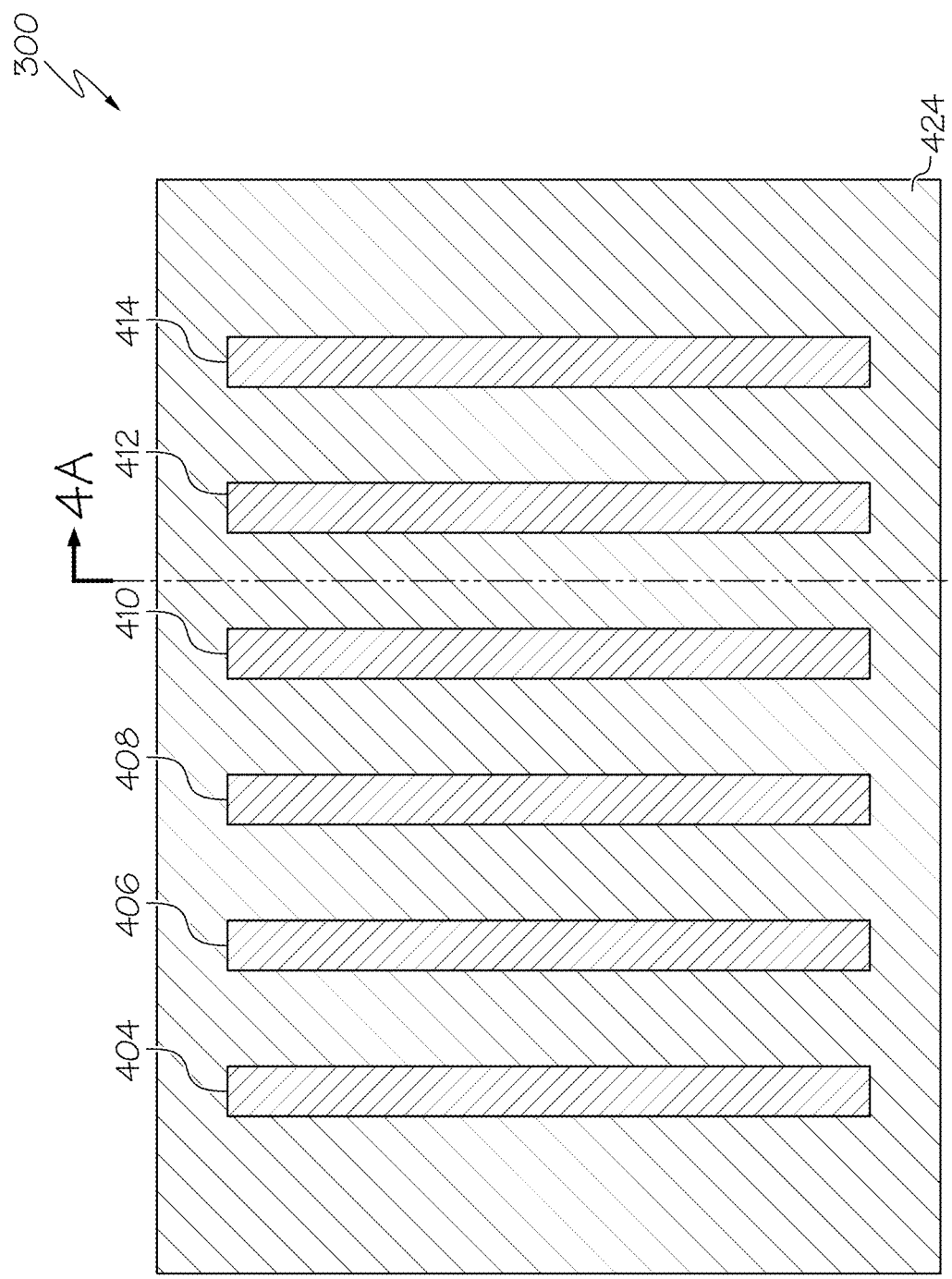
FIG. 4 is a top view of the semiconductor structure after sacrificial gate structures, source/drain regions, and an inter-level dielectric layer have been formed on the fin structures according one embodiment of the present disclosure.
Figure 4A:
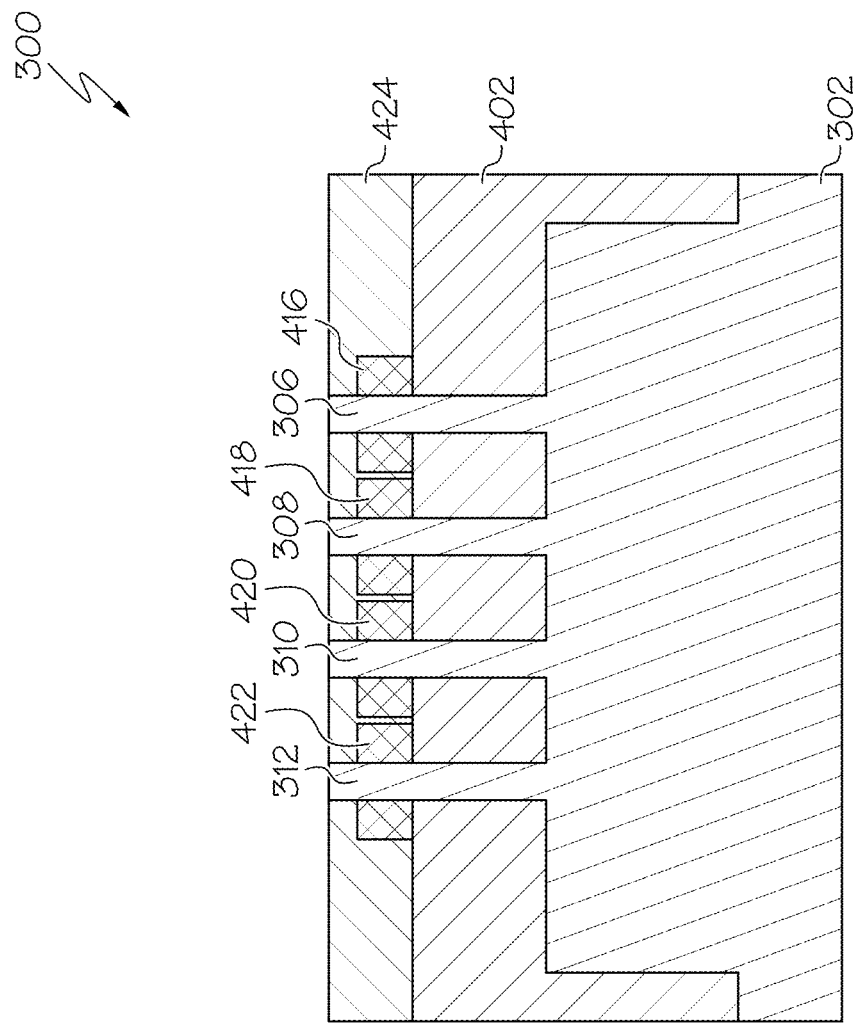
FIG. 4A is a cross-section view of the semiconductor structure after sacrificial gate structures, source/drain regions, and an inter-level dielectric layer have been formed on the fin structures according one embodiment of the present disclosure.

A trench isolation (STI) etching and dielectric fill process may be performed to form STI regions 402 over exposed regions of the substrate 402 adjacent to the fins 306 to 312, as shown in FIGS. 4 and 4A. The STI regions 402 are isolation regions formed by etching trenches in the substrate 104 and then filling the trenches with, for example, silicon oxide. Alternatively, the trenches may be lined with a silicon oxide liner formed by a thermal oxidation process and then filled with additional silicon oxide or another material. Following the deposition of the STI material, an etching process can be performed to remove portions of the STI material and expose the fins 306 to 312.

FIGS. 4 and 4A further show that sacrificial (dummy) gates 404 to 414 are formed atop and in contact with portions of the fin structures 306 to 312 defining the channel regions of the semiconductor devices. The sacrificial gates 404 to 414, in one embodiment, may also contact a top surface of the STI regions 402. In other embodiments, the sacrificial gates 404 to 414 contact a top surface of the substrate. The sacrificial gates 404 to 414 may be composed of a material that can be removed selectively to the underlying active region. The geometry of the sacrificial gates 404 to 414 defines the later formed functional gate structures, in which the sacrificial gates 404 to 414 may be replaced using a replacement metal gate (RMG) process flow.

The sacrificial gate structures 404 to 414 may be formed, in one embodiment, by depositing one or more layers comprising, for example, oxide, polysilicon, amorphous silicon, nitride, or a combination thereof. The one or more layers may then be patterned and etched using standard lithography as known in the art, e.g., by photolithography and etching. This includes application of the photoresist, light exposure, developing, etching and photoresist removal. According to other embodiments electron beam lithography may be used. Depending on the material of the sacrificial gates 404 to 414, spacers may then be formed on the sidewalls of the sacrificial gates 404 to 414 by one or more spacer formation techniques. The spacers can be formed by, for example, isotropically depositing a conformal layer of insulating material (e.g., silicon oxide, silicon nitride, silicon oxynitride, and high-k dielectric material and the like) followed by an anisotropic etch (e.g., reactive ion etch (RIE)) of that material to form spacers.

FIGS. 4 and 4A further show that after the sacrificial gates 404 to 414 have been formed, source/drain regions 416 to 422 may be formed on the source and drain portions of the fin structures 306 to 312, i.e., on the opposing ends of the fin structures with the channel region of the fin structure in between, wherein the sacrificial gates are on the channel regions. The source/drain regions 416 to 422 contact the sidewall (or spacer) of the sacrificial gates 404 to 414. The source and drain regions may be formed by ion implantation or by forming an in-situ doped epitaxial semiconductor material. In some examples, the epitaxial semiconductor material that provides the source and drain regions merges the adjacent fin structure source and drain region portions within the device regions.

Following formation of the source and drain regions, an inter-level dielectric (ILD) layer 424 may be formed between and over the sacrificial gates 404 to 414 and the source/drain regions 416 to 422. The ILD layer 424 may be formed using a deposition method, such as chemical vapor deposition (CVD), e.g., plasma enhanced chemical vapor deposition (PECVD), deposition from chemical solution, or spin on deposition. Following deposition, the inter-level dielectric layer is planarized, e.g., planarized by chemical mechanical planarization (CMP), so that the upper surface of the ILD layer 424 is coplanar with the upper surface of the sacrificial gates 404 to 414. It should be noted that in some embodiments, a liner material such as silicon nitride may be deposited in contact with the source/drain regions 416 to 422 prior to forming the ILD layer 424.

Figure 5:
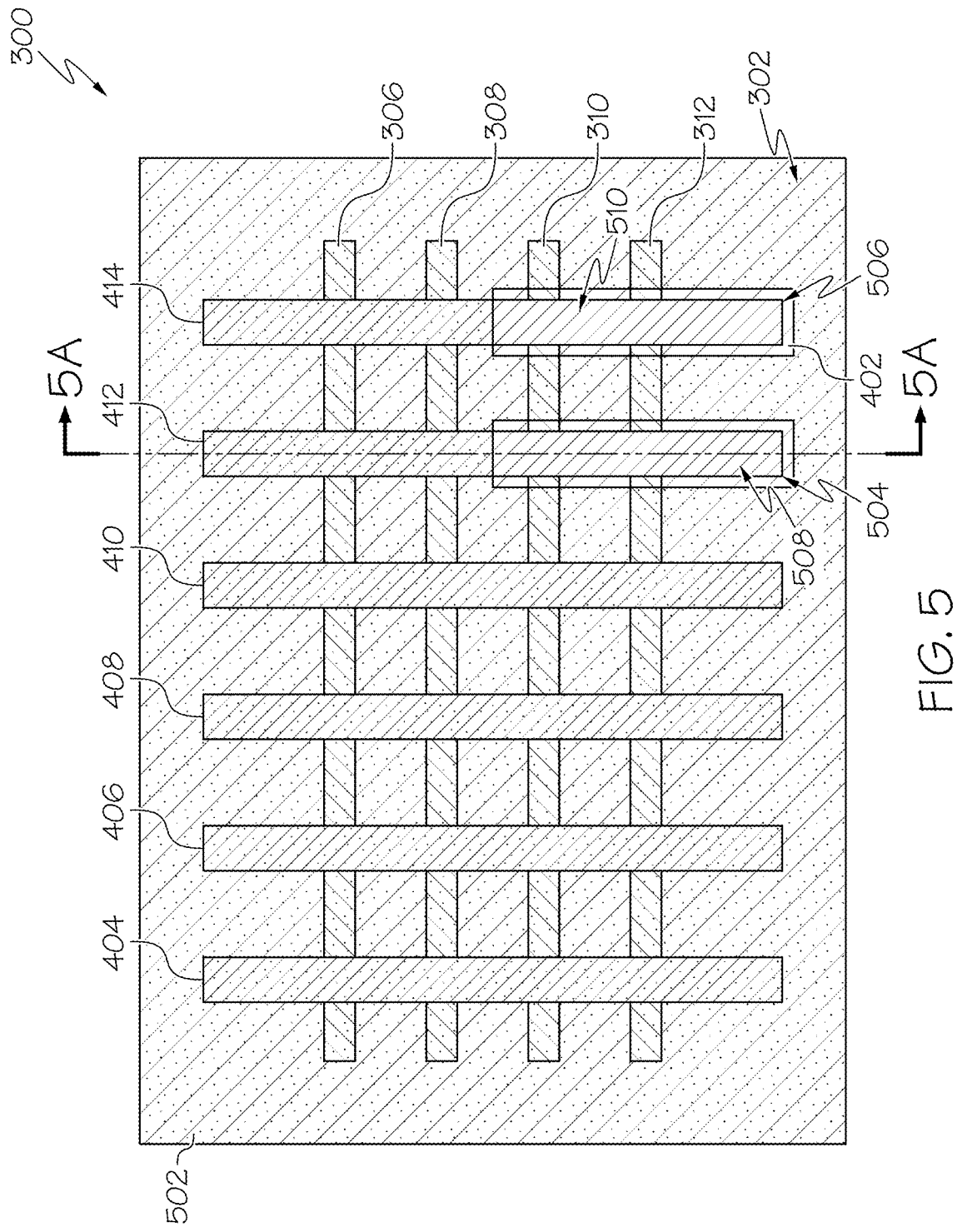
FIG. 5 is a top view of the semiconductor structure a gate cut mask has been formed over the structure with separate cut windows having been patterned to expose individual sacrificial gates according one embodiment of the present disclosure.
Figure 5A:
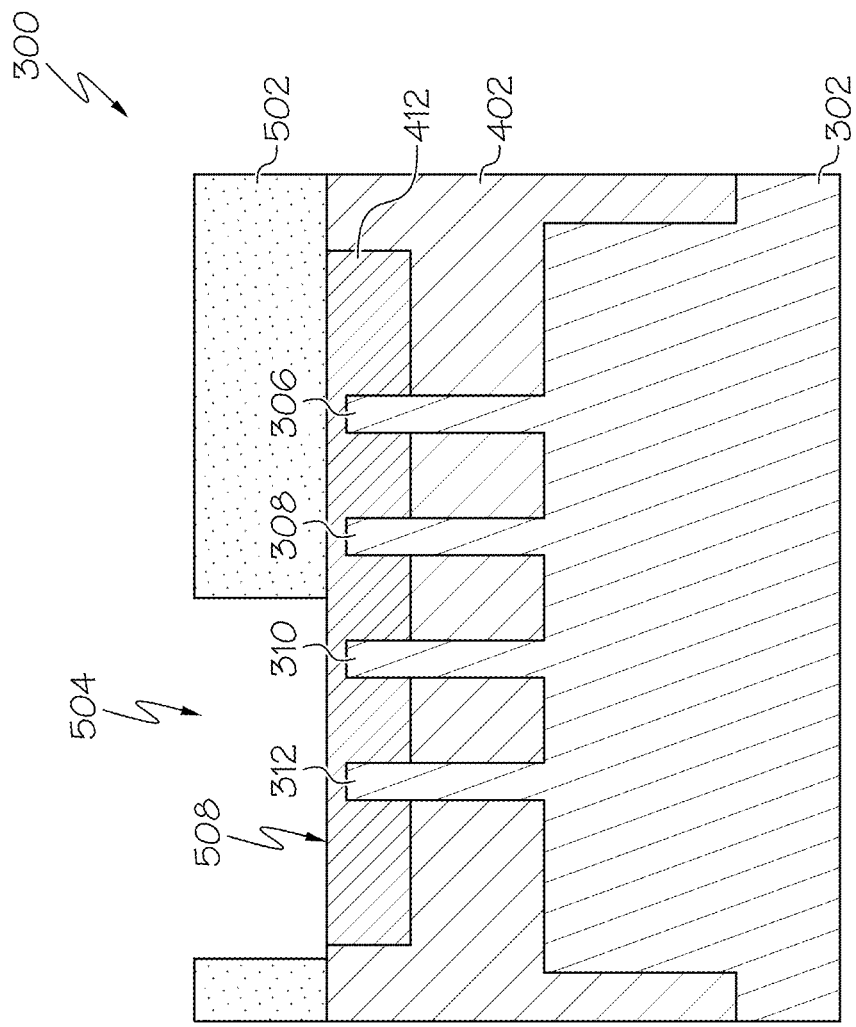
FIG. 5A is a cross-sectional view of the semiconductor structure after a gate cut mask has been formed over the structure with separate cut windows having been patterned to expose individual sacrificial gates according one embodiment of the present disclosure.

After the ILD layer 424 has been formed, one or more gate cut masks are formed on the structure and patterned to define tapered devices. FIGS. 5 and 5A illustrate one embodiment where a gate cut mask 502 is formed over the structure 300 with openings 504, 506 (also referred to herein as "cut windows 504, 506") having been patterned to expose portions 508, 510 of individual sacrificial gates 412, 414. The gate cut mask 502 is shown as being transparent for illustration purposes. In addition, the source/drain regions 416 to 422 and the ILD layer 424 are not shown for clarity.

The openings 504, 506 may be patterned to be slightly wider than the width of the sacrificial gates 412, 414. For example, the openings 504, 506 may be patterned with a width of up to 25% of the spacing between the gates. However, other dimensions are applicable as well. In one embodiment, the gate cut mask 502 may be formed utilizing a tri-layer layer stack. In this embodiment, a tri-layer layer stack is disposed over and in contact with the structure 300. The tri-layer layer stack may include a bottom layer, a middle layer, and top photoresist layer. The bottom layer may be an organic planarization layer (OPL) including a material(s) such as spin-on carbon (SOC), diamond-like carbon, polyarylene ether, polyimide, polymethyl methacrylate, polymethylisopropenyl ketone, photoresists, and/or the like. The organic planarization layer may be formed utilizing any conventional deposition process including, for example, CVD, PVD, plasma enhanced chemical vapor deposition (PECVD), evaporation, spin coating, and dip coating. Chemical mechanical planarization (CMP) and/or grinding may be used to planarize the deposited OPL. In one embodiment, the OPL layer may be between 50 nm and 200 nm thick, although lesser and greater thicknesses apply. The width biases may range from, for example, approximately 6-10 nm to compensate for overlay errors up to the maximum size allowed by the Ground Rule for the CUT layer.

The middle layer of the tri-layer stack may include an anti-reflective coating (ARC) layer such as a silicon-ARC, titanium-ARC, and/or the like. The ARC layer may be formed by, for example, one or more processes including sputtering, evaporation, CVD, PVD, ALD, and/or the like. In one embodiment, the ARC layer may be between 10 nm and 60 nm thick, although lesser and greater thicknesses apply. The top layer of the tri-layer stack may be a photoresist layer comprising a material that is sensitive to one or more types of radiation such as extreme ultraviolet (EUV) light, ultraviolet light, electron beam, X-ray, and/or the like. The photoresist material may be deposited using one or more processes such as CVD, PVD, ALD, and/or the like.

The photoresist layer of the of the tri-layer stack may be patterned using any suitable photolithography technique. For example, in on embodiment, a photomask is disposed over the photoresist layer. The photoresist layer may then be exposed to a radiation beam, and then hardened via a curing or baking process. Unexposed or exposed portions of the photoresist layer may then be removed using a developer. The foregoing process results in the desired pattern. The pattern includes portions of the photoresist layer in contact with ARC layer with openings between these portions exposing the ARC layer. In some embodiments, the portions of the photoresist layer may be trimmed using, for example, an anisotropic plasma etch process.

After the photoresist layer has been patterned, the pattern is transferred to the ARC layer and the OPL layer. For example, a selective etching process is used to first transfer the pattern to the ARC layer. A separate selective etching process is then used to transfer the pattern to the OPL layer. Alternatively, the ARC layer and the OPL layer may be etched using a single etching process. After etching the ARC layer and the OPL layer, the photoresist layer and the ARC layer may be removed by, for example, a trimming process such as an anisotropic plasma etch. Therefore, in some embodiments, the gate cut mask 502 may be a patterned OPL layer. However, in other embodiments, the photoresist layer and the ARC layer may not be removed and the gate cut mask 502 comprises the OPL, ARC, and photoresist layers. It should be noted that embodiments of the present invention are not limited to utilizing a tri-layer process for forming the gate cut mask 502. For example, the gate cut mask 502 may comprise a photoresist layer that is patterned by exposing the photoresist layer to a desired pattern of radiation and then, using a resist developer to develop exposed portions of the photoresist layer.

Figure 6:
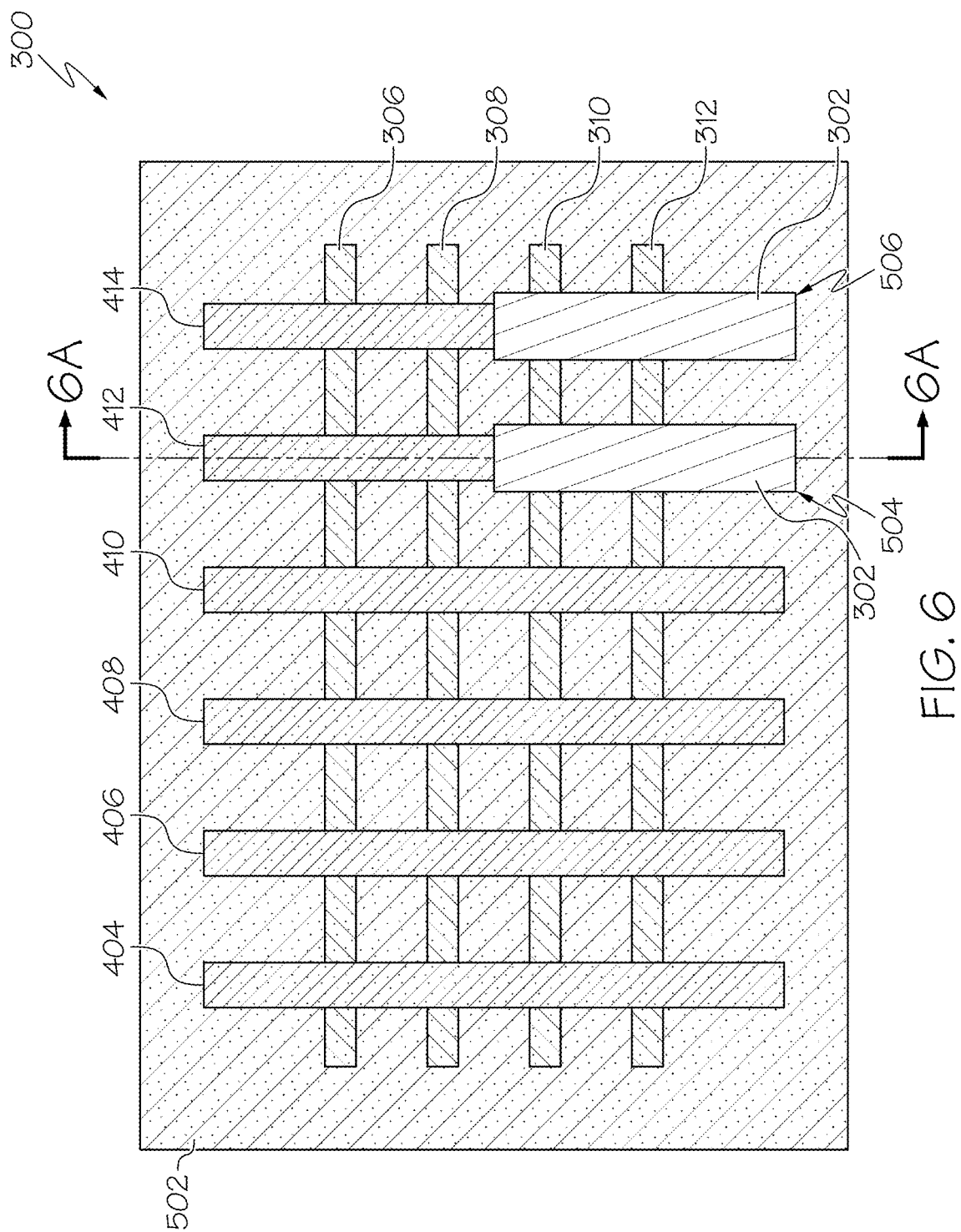
FIG. 6 is a top view of the semiconductor structure after the exposed individual sacrificial gate portions and their underlying fin portions have been cut according one embodiment of the present disclosure.
Figure 6A:
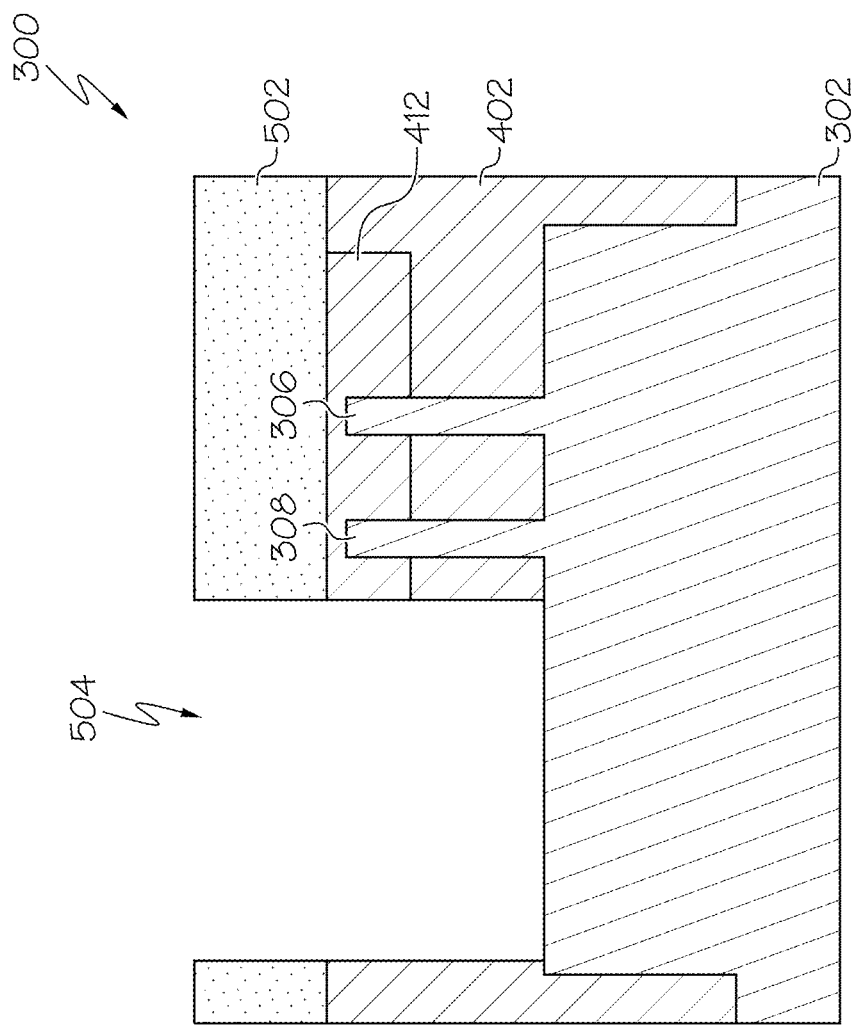
FIG. 6A is a cross-sectional view of the semiconductor structure after the exposed individual sacrificial gate portions and their underlying fin portions have been cut according one embodiment of the present disclosure.
Figure 6B:
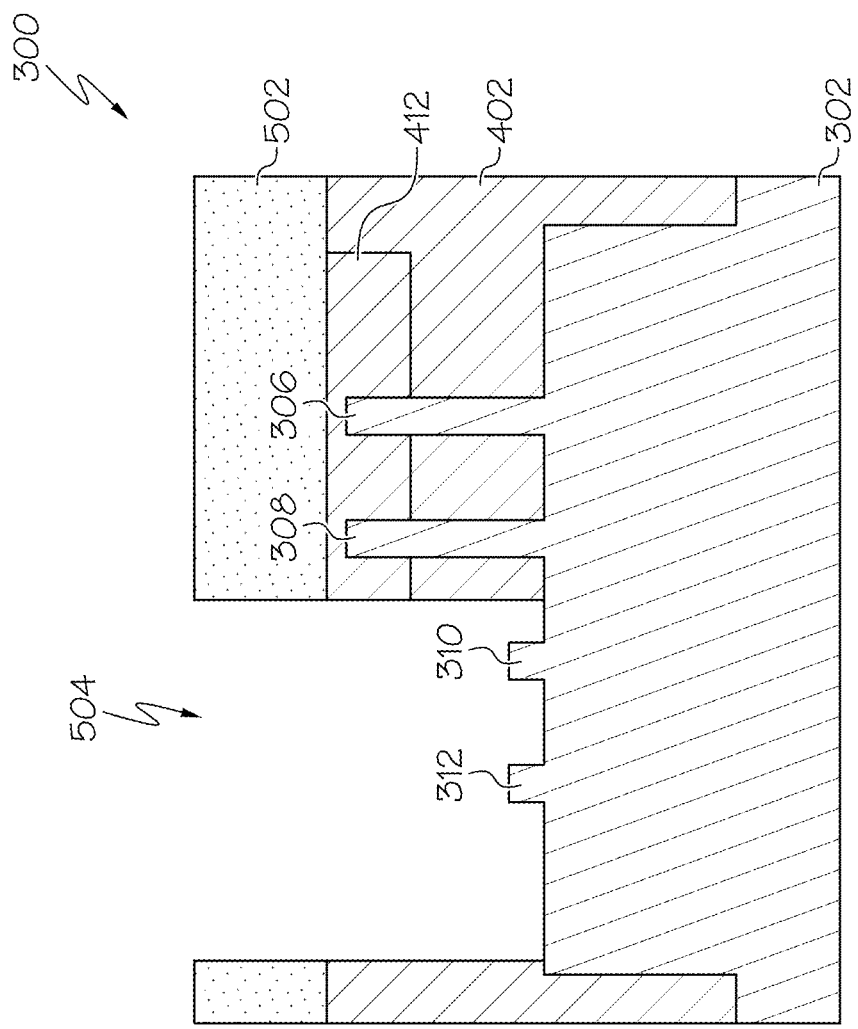
FIG. 6B is a cross-sectional view of the semiconductor structure after the exposed individual sacrificial gate portions and their underlying fin portions have been cut according to another embodiment of the present disclosure.

After the gate cut mask 502 has been formed, the exposed portions 508, 510 of the individual sacrificial gates 412, 414 are removed. In at some embodiments, the sacrificial gate portions 508, 510 may be removed by any suitable etching process known in the art capable of selectively removing the sacrificial gate portions 508, 510 without substantially removing material from any gate spacer material. For example, the sacrificial gate portions 508, 510 may be removed using a wet chemical etch, such as potassium hydroxide (KOH), or ammonium hydroxide ($NH_4OH$), or a dry etch such as RIE. The etching of the sacrificial gate portions 508, 510 also removes the underlying fin portions and surrounding insulating material 402, as shown in FIGS. 6 to 6B.

Accordingly, not only does the gate cutting process cut portions 508, 510 of the sacrificial gates 412, 414 but also cuts portions of the underlying fin structures (active area cut). For example, FIGS. 6 and 6A show that the exposed portions 508, 510 of the sacrificial gates 412, 414; the underlying fin portions; and insulating material 402 have been removed to expose a portion of the top surface of the substrate 302. In some embodiments, etching of the gate cutting process is controlled such that the underlying fin portions and surrounding insulating material 304 are not completely removed, as shown in FIG. 6B. This helps prevent any unwanted damage from occurring to the substrate 104 during the etching process. The source/drain regions are protected by the ILD layer 424 (and liner) and, therefore, are not cut.

Figure 7:
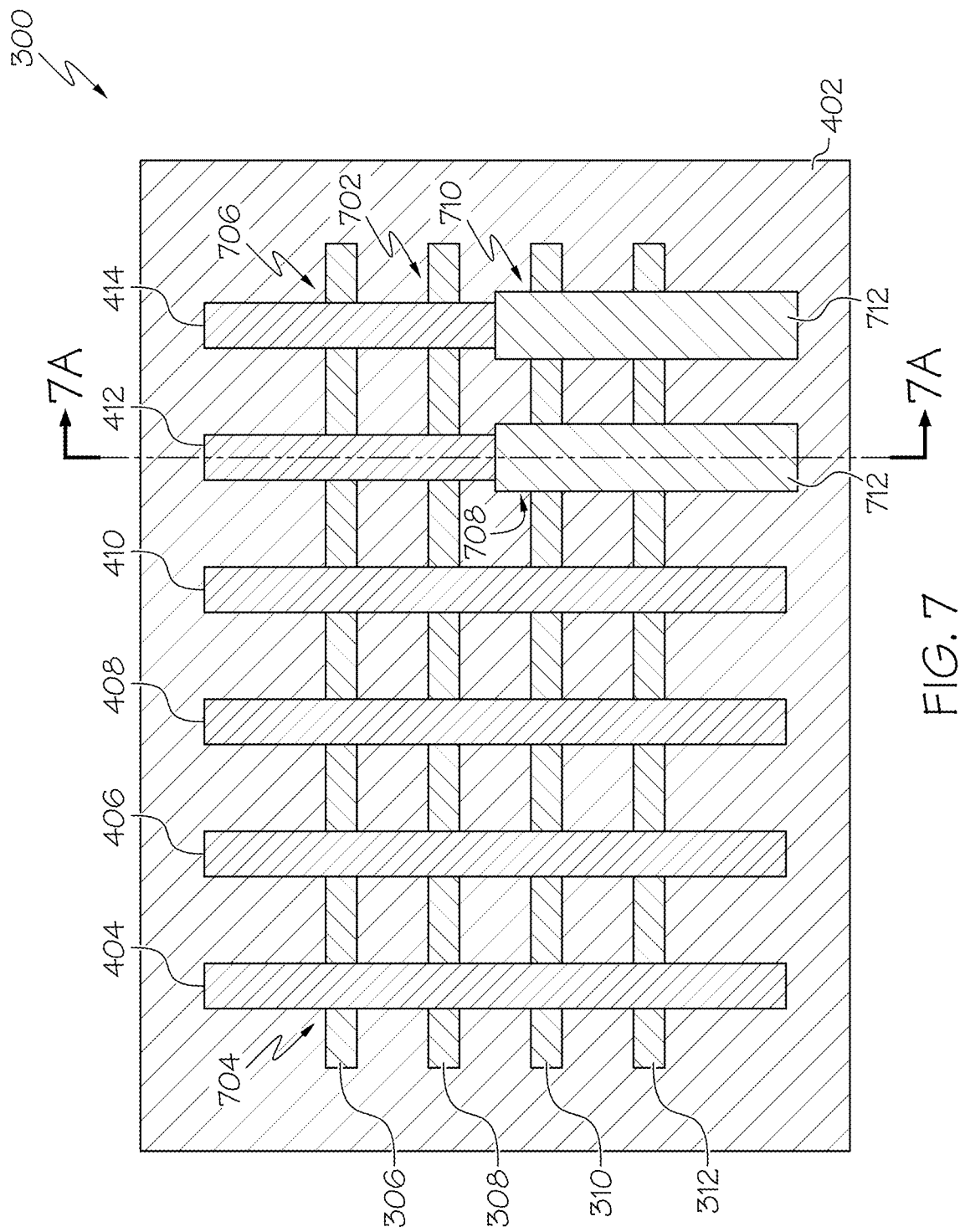
FIG. 7 is a top view of the semiconductor structure after the gate cut mask has been removed according one embodiment of the present disclosure.

The gate cut mask 502 may then be removed using, for example, one or more plasma etching processes as shown in FIG. 7. The structure 300 shown in FIG. 7 comprises a substantially non-rectangular shaped active region 702 defined by the fins 306 to 312. This results in the formation of finFET devices having different number of fins, which are referred to as tapered finFET devices. For example, FIG. 7 that the structure 100 comprises one or more finFET devices 704 comprising four fins and one or more tapered finFET devices 706 comprising two fins.

Figure 7A:
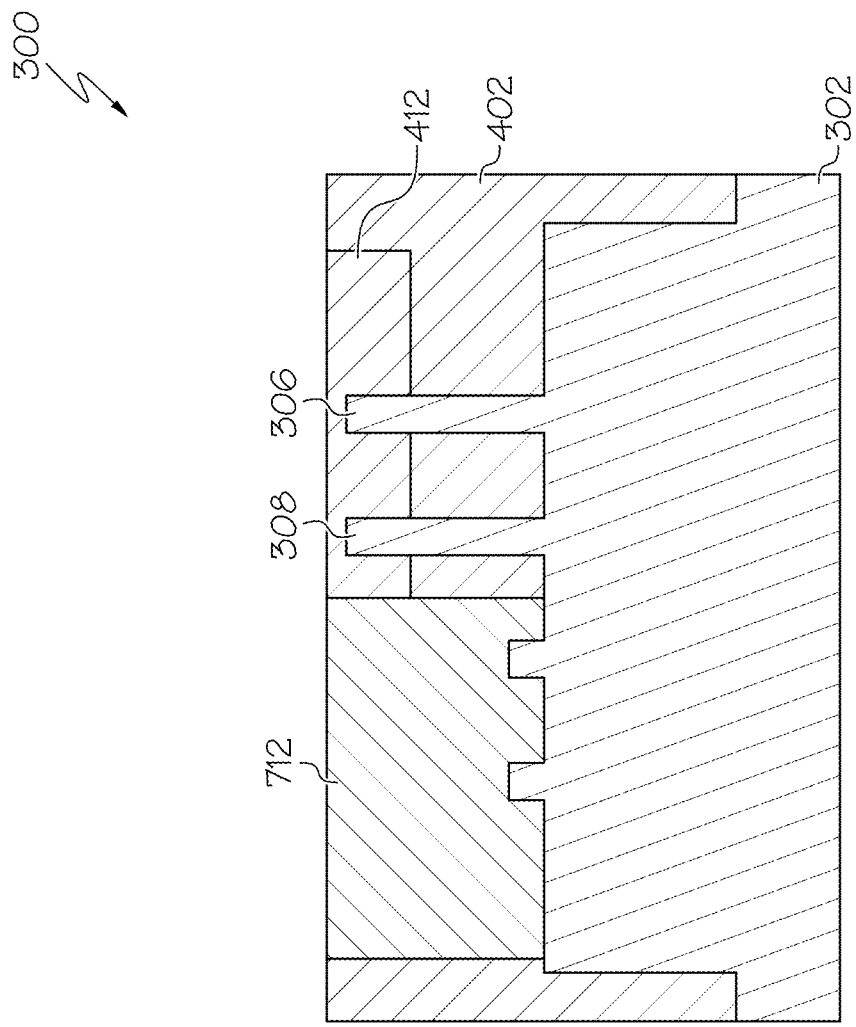
FIG. 7A is a cross-sectional view of the semiconductor structure after the gate cut mask has been removed and a dielectric layer has been formed within trenches created by the gate/fin cutting process according one embodiment of the present disclosure.

FIG. 7 further shows that portions of the substrate 302 are exposed within cut areas 708, 710 corresponding to the cut windows 504, 506. Another ILD layer 712 may be formed over the structure to fill the cavity created by the cutting process, as shown in FIG. 7A. The additional ILD layer 712 is planarized, e.g., planarized by chemical mechanical planarization (CMP), so that the upper surface of the ILD layer 712 is coplanar with the upper surface of the remaining sacrificial gates 404 to 414. Defining tapered devices during the gate cut process is advantageous over defining tapered devices during the active area cutting process because the pitch between gates is larger than the pitch between fins. Therefore, any adverse effects resulting from corner rounding of the gate cut mask are mitigated or eliminated.

Figure 8:
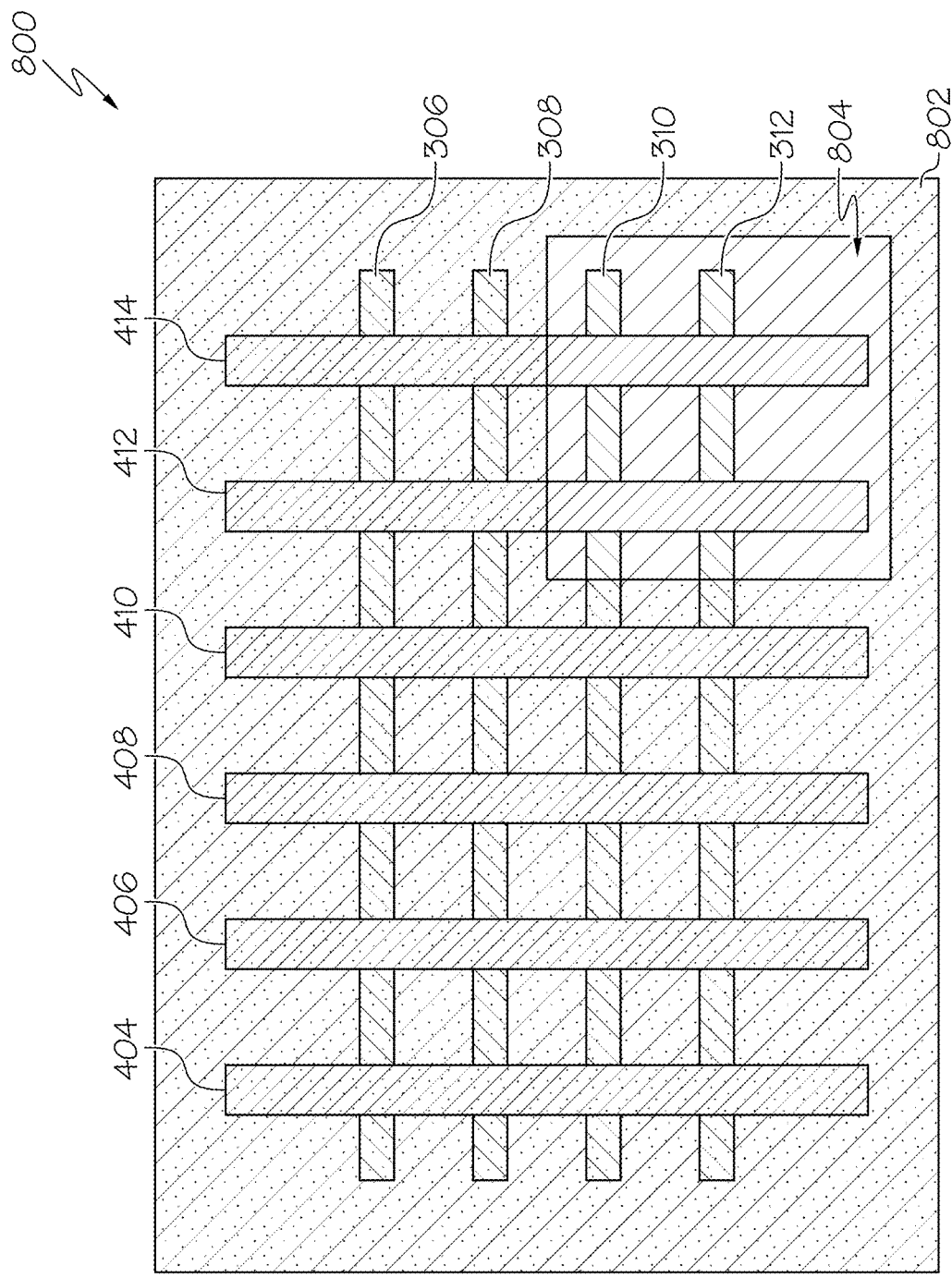
FIG. 8 is a top view of a semiconductor structure comprising fin structures and sacrificial gate structures after a gate cut mask has been formed over the structure with a single cut window having been patterned to expose individual sacrificial gates and portions of fin structures there between according one embodiment of the present disclosure.

The tapered device(s) 706 in FIG. 7 are broken up in sections where a gate was running over them. In other words, a separate cut window 504, 506 was patterned for each individual sacrificial gate and fin portions that were to be removed. However, in other embodiments, a single cut window 804 may be patterned in the cut mask 802 for all sacrificial gate and fin portions that are to be removed, as shown in FIG. 8. Stated differently, the gate cut process in this embodiment complete removes fin structures within in the tapered as compared to cutting the fins into multiple sections.

Figure 9:
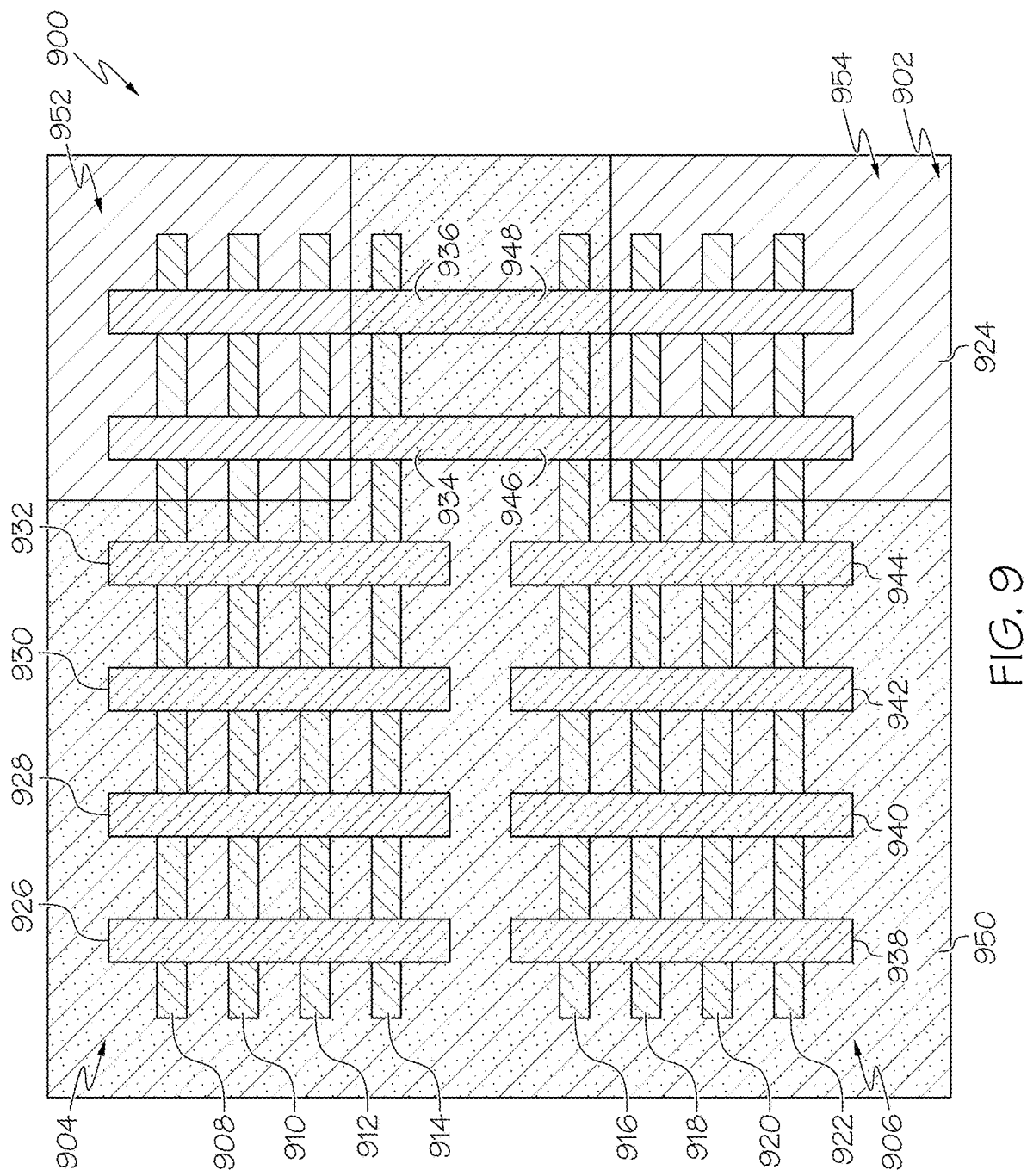
FIG. 9 is a top view of a semiconductor structure a gate cut mask has been formed over the structure with a first cut window having been patterned to expose individual sacrificial gates and portions of fin structures there between in a pFET region, and a second cut window having been patterned to expose individual sacrificial gates and portions of fin structures there between in a nFET region according one embodiment of the present disclosure.

In addition, the tapered devices of one or more embodiments are not limited to the number of fins shown in FIG. 7, as tapered devices with any number of differing fins may be defined/fabricated by embodiments of the present invention. For example, FIG. 9 shows a substrate 902, where a first plurality of fin structures 908 to 914 for a pFET device 904 and a second plurality fin structures 916 to 922 for a nFET device 906 have been formed thereon. FIG. 9 further shows that STI regions 924 comprising an insulating material have also been formed over exposed regions of the substrate 902 adjacent to the fins 908 to 922. The fins 908 to 922 and STI regions 924 may be formed using processes similar to those discussed above with respect to FIGS. 3 and 4.

FIG. 9 further shows a first plurality of sacrificial gates 926 to 936 have been formed over and in contact with portions of the first plurality of fin structures 908 to 914, and a second plurality of sacrificial gates 938 to 948 have been formed over and in contact with portions of the second plurality of fin structures 916 to 922. The sacrificial gates 938 to 948 may be formed using processes similar to those discussed above with respect to FIG. 4. FIG. 9 also shows that one or more of the pFET sacrificial gates 926 to 936 and nFET sacrificial gates 938 to 948 may be connected. Source/drain regions and an ILD layer are also formed, as discussed above with respect to FIG. 4. These features are not shown for clarity.

A gate cut mask 950 has been formed over and in contact with the pFET device 904 and the nFET device 906, The gate cut mask 950 has been patterned to comprise a single opening 952 (also referred to herein as "first cut window 952) spanning across multiple sacrificial gates in the pFET device 904, and a single opening 954 (also referred to herein as "second cut window 954) spanning across multiple sacrificial gates in the nFET device 906. For example, the first cut window 952 exposes portions of multiple sacrificial gates 934, 936 and fin structures 908 to 912. The second cut window 954 exposes portions of multiple sacrificial gates 946. 948 and fin structures 918 to 922.

In the example shown in FIG. 9, each the gate cut mask 950 defines a four-fin finFET device and a single-fin finFET device in each of the pFET and nFET regions. However, in other embodiments, the gate cut mask 950 is patterned such that the cut windows 952, 954 expose portions of two fins and their gate portions; portions of one fin and its gate portion; or any other number of required fin and gate portions to define tapered devices with more than a single fin. The gate cut mask 950 of FIG. 9 may be formed and patterned using processes similar to those discussed above with respect to FIG. 6. Once the gate cut mask 950 has been formed, the exposed portions of the sacrificial gates 934, 936, 946, 948 and their underlying fin portions; the exposed portions of fin structures 908 to 912; the exposed portions of fin structures 918 to 922; and exposed portions of the STI region material 924 may be removed using processes similar to those discussed above with respect to FIGS. 6 to 6B. In some embodiments, etching of the gate cutting process is controlled such that the underlying fin portions and surrounding insulating material are not completely removed.

Figure 10:
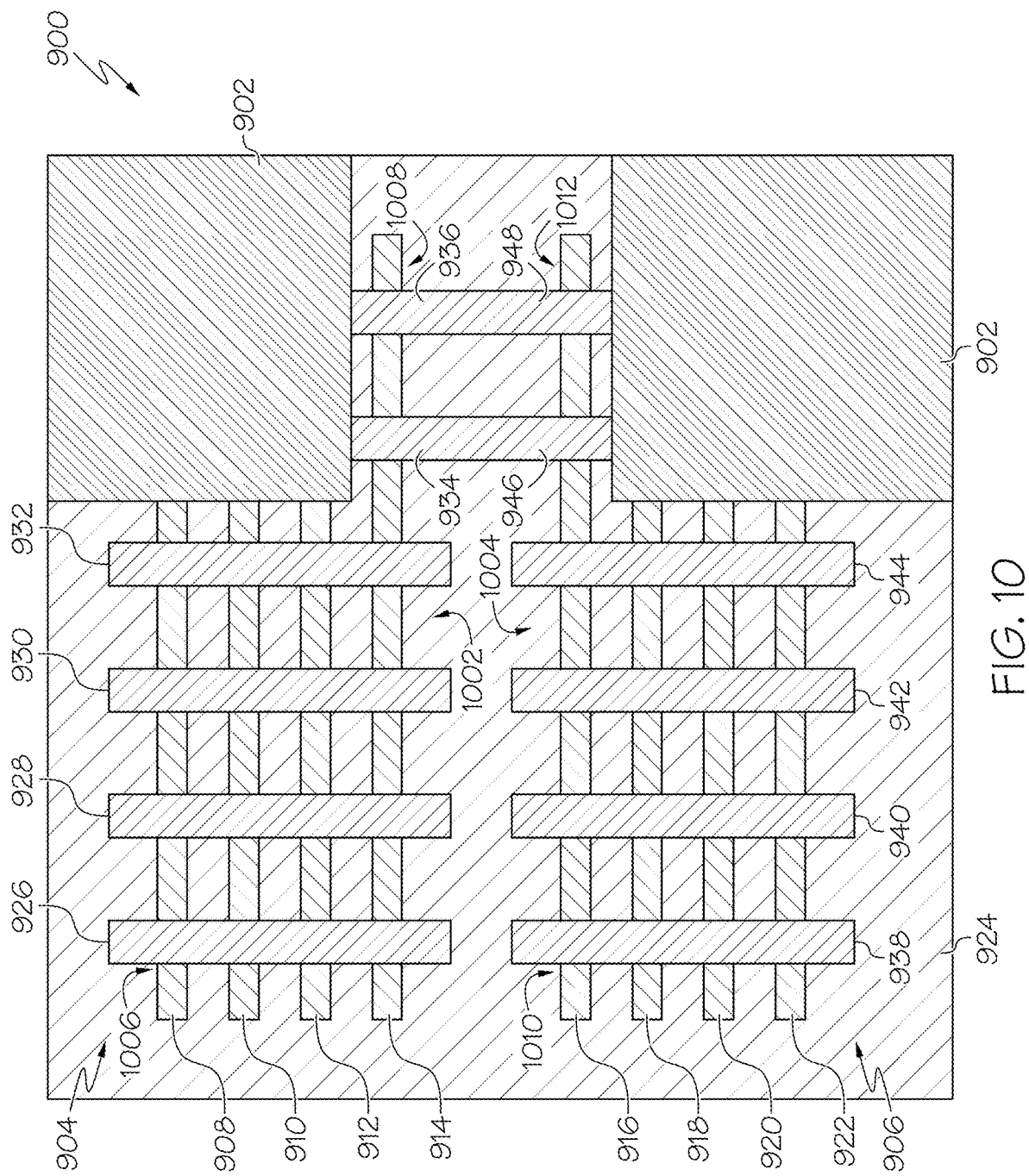
FIG. 10 is a top view of the semiconductor structure of FIG. 9 after the exposed individual sacrificial gate portions and their underlying fin portions in the pFET and nFET regions have been cut according one embodiment of the present disclosure.

FIG. 10 shows the structure 900 after performing a gate cutting process utilizing the gate cut mask 950 of FIG. 9 and after removing the gate cut mask 950. In particular, FIG. 10 shows the structure 900 comprising substantially non-rectangular shaped active regions 1002, 1004 in both the pFET and nFET areas 904, 906. The structure 900 comprises a p-type finFET device 1006 comprising four fins; a tapered p-type device 1008 comprising a single fin; and an exposed portion of the substrate 902. The structure 1000 also comprises an n-type finFET device 1010 comprising four fins and tapered n-type device 1012 comprising a single fin. FIG. 10 further shows that portions of the substrate 302 are exposed within cut areas 1014, 1016 corresponding to the cut windows 952, 954.

Figure 11:
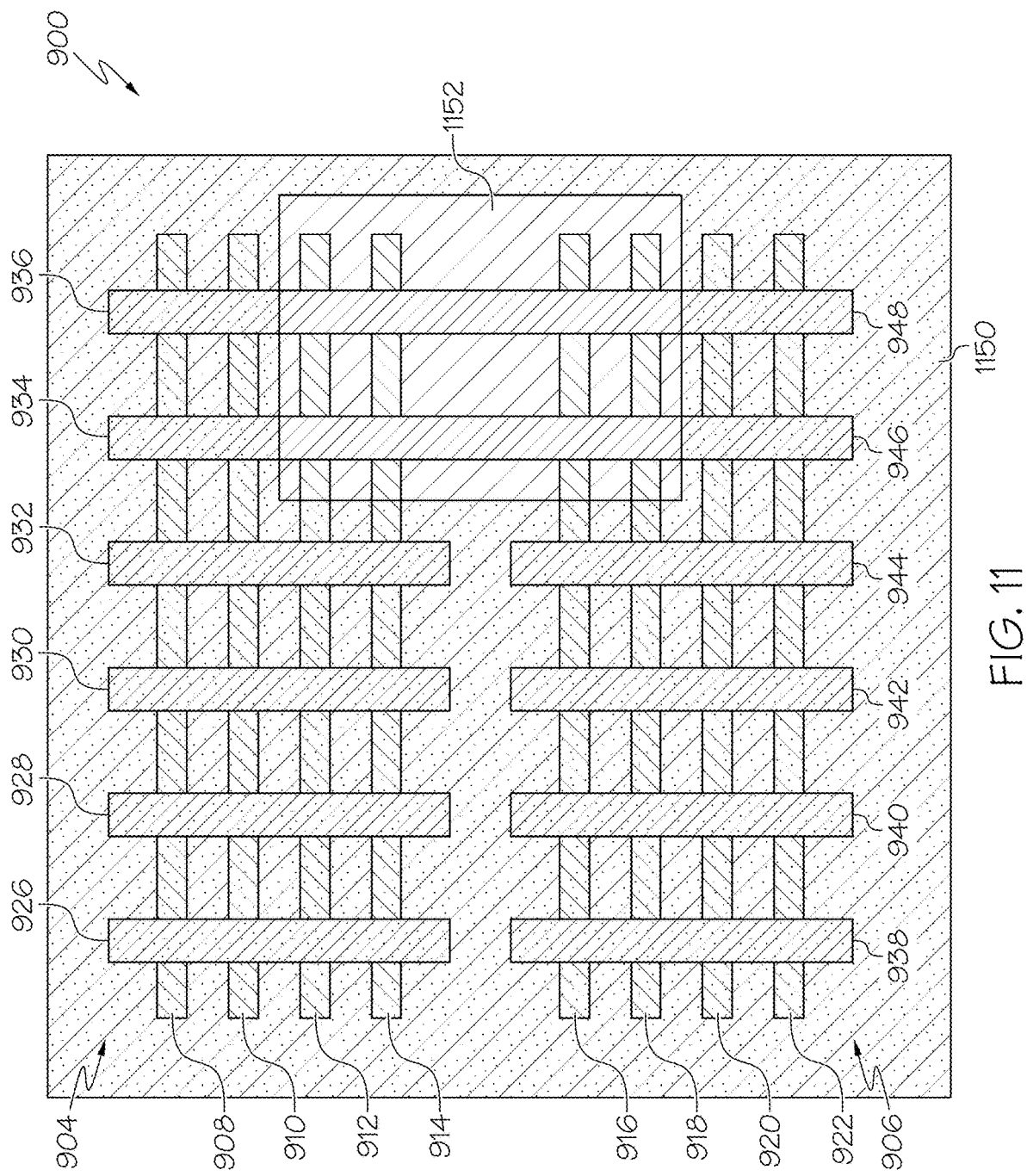
FIG. 11 is a top view of a semiconductor structure a gate cut mask has been formed over the structure with a single cut window having been patterned to expose individual sacrificial gates and portions of fin structures there between in both a pFET region and nFET region according one embodiment of the present disclosure.

In the example shown in FIG. 9, the cut windows 952, 954 were disposed such that gate and fin cuts are done on the power rail side of the devices to prevent issues with subsequently formed gate contacts. However, in other embodiments a single cut window 1152 may be patterned in the gate cut mask 1150 and be disposed over inner portions of both the pFET and nFET devices 904, 906. In this embodiment, the single cut widow 1152 spans across portions of both the pFET and nFET devices 904, 906 as shown in FIG. 11 to define tapered devices in the pFET and nFET regions.

Figure 12:
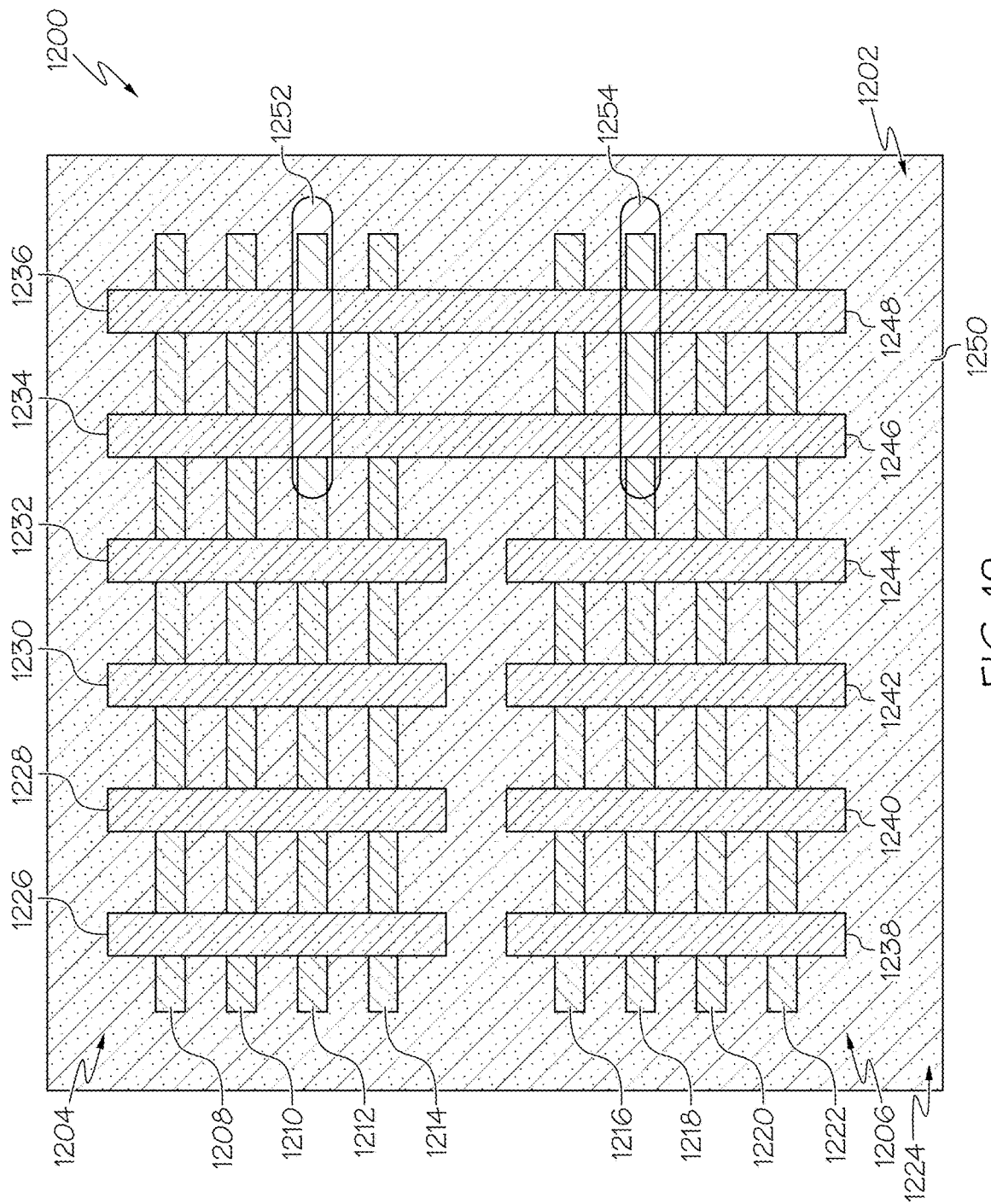
FIG. 12 is a top view of a semiconductor structure a gate cut mask has been formed over the structure with a first cut window having been patterned to expose individual sacrificial gates and portions of a single fin structures there between in a pFET region, and a second cut window having been patterned to expose individual sacrificial gates and portions of a single fin structure there between in a nFET region according one embodiment of the present disclosure.

FIG. 12 shows a structure 1200 similar to the structure 900 of FIG. 9 having a substrate 1202; a first plurality of fin structures 1208 to 1214 for a pFET device 1204 and a second plurality of fin structures 1216 to 1222 for a nFET device 906 have been formed thereon. FIG. 12 further shows that STI regions 1224 comprising an insulating material have also been formed over exposed regions of the substrate 1202 adjacent to the fins 1208 to 1222. FIG. 12 further shows a first plurality of sacrificial gates 1226 to 1236 have been formed over and in contact with portions of the first plurality of fin structures 1208 to 1214, and a second plurality of sacrificial gates 1238 to 1248 have been formed over and in contact with portions of the second plurality of fin structures 1216 to 1222. FIG. 12 also shows that one or more of the pFET sacrificial gates 1226 to 1236 and nFET sacrificial gates 1238 to 1248 may be connected. Source/drain regions and an ILD layer are also formed, as discussed above with respect to FIG. 4. These features are not shown for clarity.

A first gate cut mask 1250 has been formed over and in contact with the pFET device 1204 and the nFET device 1206. In this embodiment, the gate cut mask 1250 comprises openings 1252, 1254 (also referred to herein as "cut windows 1252, 1254") exposing only portions of a single fin structure 1212, 1220. Stated differently, the gate cut windows/shapes 1252, 1254 that define the tapered device regions span across multiple sacrificial gates 1234, 1236, 1248, 1246 but cut the sacrificial gates for only 1 fin pitch wide. In the example shown in FIG. 12, the gate cut windows/shapes 1252, 1254 define tapered single fin p-type and n-type finFET devices since the fins to the outside (not between) of the gate cut windows/shapes 1252, 1254 become electrically inactive after the gate cutting process. Tapered devices with a greater number of fins may be defined by moving the gate cut windows/shapes 1252, 1254 a given number of fins towards the outside of devices such that the number of desired fins are between the cut windows/shapes 1252, 1254.

In the example shown in FIG. 12, the narrow width (e.g., 1-fin wide) of the cut windows/shapes 1252, 1254 precludes the windows from having rectangular corners. Therefore, the issues with corner rounding during cut mask formation are avoided. The cut windows 1252, 1254 may be implemented using, for example, directed self-assembly (DSA) and/or extreme ultraviolet lithography (EUV). EUV uses a smaller wavelength (13.5 nm) for exposure to print narrow width. However for DSA, ArF wavelength (193 nm) is used but it is only required to print a wide guiding pattern (typically twice the size of the required cut width). The subsequent DSA process will shrink the guiding pattern into a half-wide or even narrower patterns. It should be noted that other lithography technologies such as (but not limited to) deep ultraviolet (DUV) lithography are applicable as well.

Figure 13:
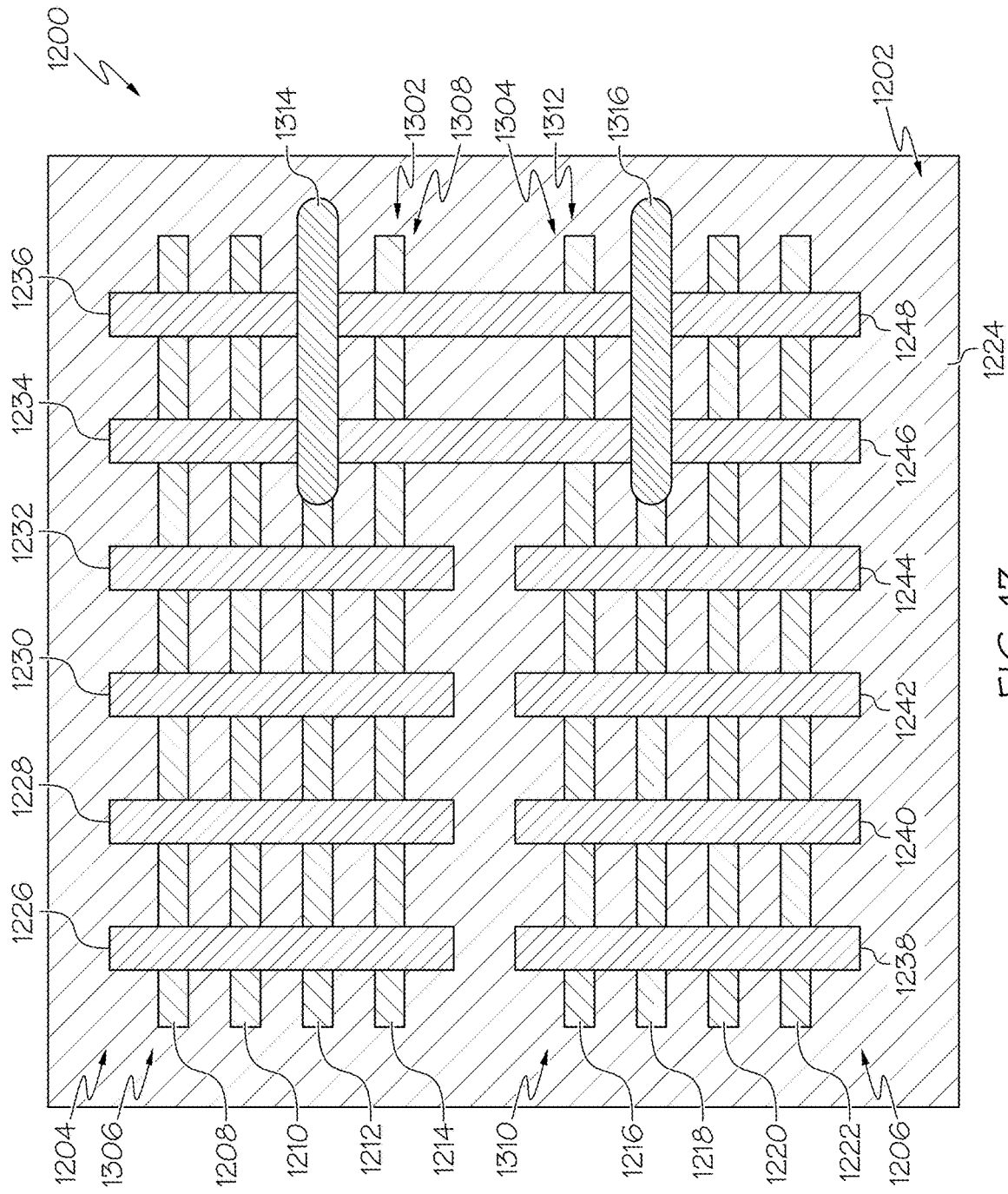
FIG. 13 is a top view of the semiconductor structure of FIG. 9 after the exposed individual sacrificial gate portions and their underlying single fin portions in the pFET and nFET regions have been cut according one embodiment of the present disclosure.

FIG. 13 shows the structure 1200 after performing a gate cutting process utilizing the gate cut mask 1250 of FIG. 12 and after removing the gate cut mask 1250. In particular, FIG. 13 shows the structure 1200 comprising substantially non-rectangular shaped active regions 1302, 1304 in both the pFET and nFET areas 1204, 1206. The structure 1200 comprises a p-type finFET device 1306 comprising four fins; a tapered p-type device 1308 comprising a single fin; and an exposed portion of the substrate 1202 within a cut area 1314. The structure 1200 also comprises an n-type finFET device 1310 comprising four fins; tapered n-type device 1312 comprising a single fin; and an exposed portion of the substrate 1202 within a cut area 1316.

After the tapered devices have been defined/formed, conventional processing may be performed to complete the devices. For example, any additional gate cuts may be made using a process similar to that discussed above with respect to FIG. 5. Following the additional gate cuts an ILD layer may be formed and polished to fill in the cavities created by the gate cutting process. The sacrificial gates 404 to 414 are then selectively removed with respect to fins 306 to 312 (e.g., via selective etching) and any spacers. This creates trenches within the ILD layer that exposes the channel regions situated under the sacrificial gates. One or more functional gate stacks are then formed on the exposed portions of the fins 306 to 312. For example, a thin conformal layer of gate dielectric and thick layers of gate conductor material and optional nitride are deposited. The gate dielectric may contact, for example, sidewalls of the exposed portions of the fins 306 to 312 and a top surface of the exposed portions of the fins 306 to 312. The gate conductor may contact inner sidewalls of the and a top surface of a bottom portion of the gate dielectric.

In some embodiments, a work function metal layer may be formed in contact with the gate dielectric layer prior to forming the gate conductor. The work function metal layers may be formed in contact with and conformal to the gate dielectric layer employing CVD, sputtering, or plating. The work function metal layers comprise one or more metals having a function suitable to tune the work function of nFETs or pFETs. Examples of metals that may be employed in the work function metal layer include, but are not limited to lanthanum (La), titanium (Ti), and tantalum (Ta).

It should be noted that if sidewall spacers were not formed for the sacrificial gates, sidewall spacers may be formed prior to forming the replacement gates. For example, the sidewall spacers may be formed by inner spacer formation process after the sacrificial gates are removed but prior to dielectric and metal gate depositions. After the replacement gate structures have been fabricated, a dielectric layer may then be formed over the entire structure. Contact trenches may then be formed in the dielectric layer to expose portions of, for example, the source/drain regions and the replacement gate structure. One or more contact materials are then deposited within the contact trenches to form contacts. It should be noted that embodiments of the present invention are not limited to the processes discussed above for completing the tapered devices, as other fabrications processes and steps are applicable as well.

Figure 14:
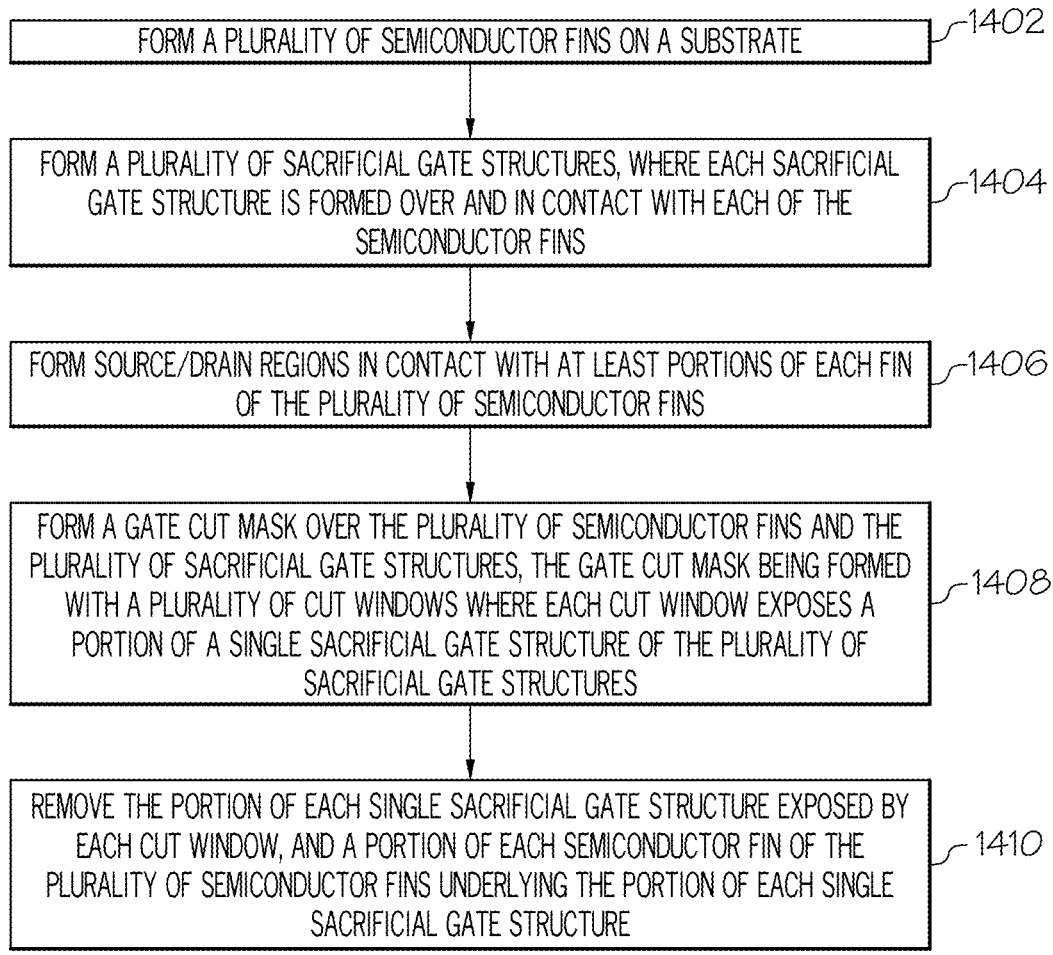
FIG. 14 is an operational flow diagram illustrating one example of a process for fabricating tapered semiconductor devices according one embodiment of the present disclosure.

FIG. 14 is an operational flow diagram illustrating one example of a process for fabricating tapered semiconductor devices according to one or more embodiments of the present invention. It should be noted that each of the steps shown in FIG. 14 has been discussed in greater detail above with respect to FIGS. 1 to 13. A first plurality of semiconductor fins, at step 1402, is formed on a substrate. A plurality of sacrificial gate structures, at step 1404, is formed. Each sacrificial gate structure is formed over and in contact with each of the plurality of semiconductor fins. Source/drain regions, at step 1406, are formed in contact with at least portions of each fin of the plurality of semiconductor fins. A gate cut mask, at step 1408, is formed over the plurality of semiconductor fins and the plurality of sacrificial gate structures. The gate cut mask is formed with a plurality of cut windows where each cut window exposes a portion of a single sacrificial gate structure of the plurality of sacrificial gate structures. The portion of each single sacrificial gate structure exposed by each cut window, and a portion of each semiconductor fin of the plurality of semiconductor fins underlying the portion of each single sacrificial gate structure are removed at step 1410.

Figure 15:
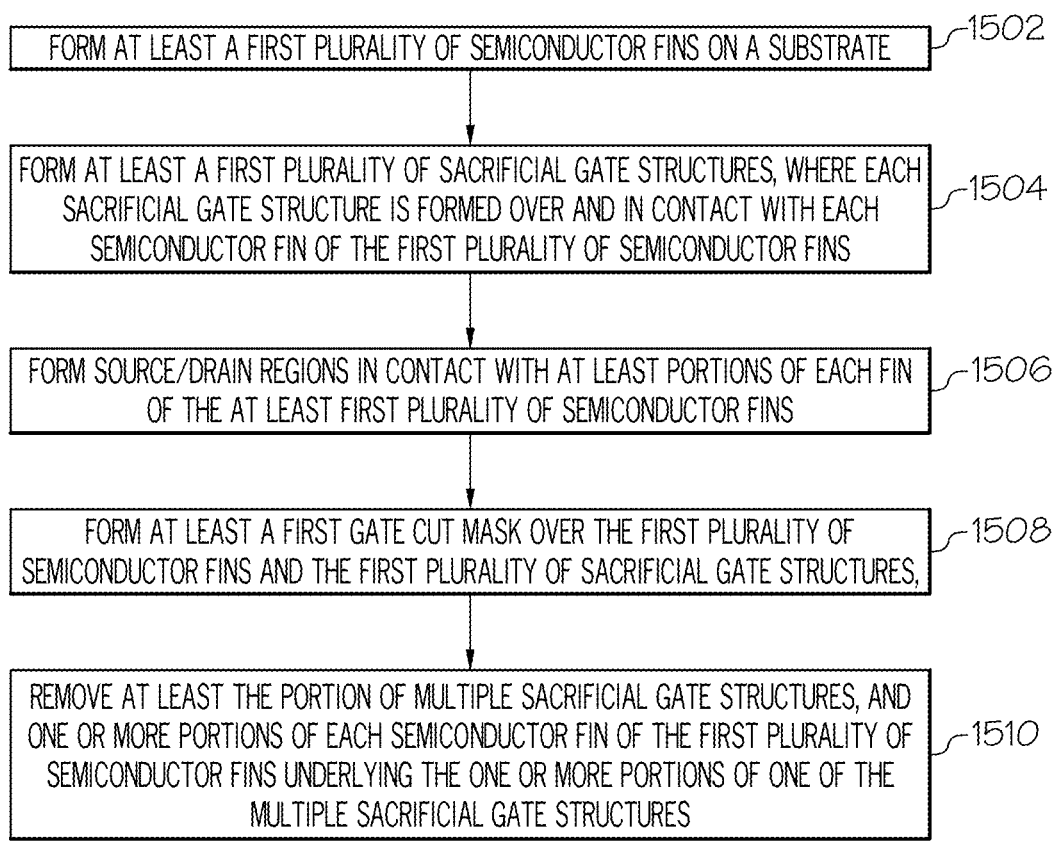
FIG. 15 is an operational flow diagram illustrating another example of a process for fabricating tapered semiconductor devices according one embodiment of the present disclosure.

FIG. 15 is an operational flow diagram illustrating another example of a process for fabricating tapered semiconductor devices according to one or more embodiments of the present invention. It should be noted that each of the steps shown in FIG. 15 has been discussed in greater detail above with respect to FIGS. 1 to 13. At least a first plurality of semiconductor fins, at step 1502, is formed on a substrate. At least a first plurality of sacrificial gate structures, at step 1504, is formed. Each sacrificial gate structure is formed over and in contact with each of the first plurality of semiconductor fins. Source/drain regions, at step 1506, are formed in contact with at least portions of each fin of the at least first plurality of semiconductor fins. At least a first gate cut mask, at step 1508, is formed over the first plurality of semiconductor fins and the first plurality of sacrificial gate structures. The at least first gate cut mask is formed with one cut window exposing one or more portions of multiple sacrificial gate structures of the first plurality of sacrificial gate structures. At least the portion of multiple sacrificial gate structures and one or more portions of each semiconductor fin of the first plurality of semiconductor fins underlying the one or more portions of one of the multiple sacrificial gate structures are removed, at step 1510.

Although specific embodiments have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also note that these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A method for forming tapered semiconductor devices, the method comprising at least:
   forming a plurality of semiconductor fins on a substrate;
   forming a plurality of sacrificial gate structures, where each sacrificial gate structure is formed over and in contact with each of the semiconductor fins;
   forming a gate cut mask over at least the plurality of semiconductor fins and the plurality of sacrificial gate structures, the gate cut mask being formed with a plurality of cut windows where each cut window exposes a portion of a single sacrificial gate structure of the plurality of sacrificial gate structures; and
   removing the portion of each single sacrificial gate structure exposed by each cut window, and a portion of each semiconductor fin of the plurality of semiconductor fins underlying the portion of each single sacrificial gate structure.

2. The method of claim 1, wherein removing the portion of each semiconductor fin defines at least one tapered device structure comprising only a subset of semiconductor fins of the plurality of semiconductor fins.

3. The method of claim 1, further comprising:
   forming source/drain regions in contact with portions of each fin of the plurality of semiconductor fins prior to forming the gate cut mask.

4. The method of claim 1, wherein the removing forms one or more trenches, and wherein the method further comprises:
   forming a dielectric layer within the one or more trenches; and
   removing remaining sacrificial gate structures of the plurality of sacrificial gate structures after the dielectric layer has been formed in the one or more trenches.

5. The method of claim 4, further comprising:
   forming a plurality of gate stacks, wherein each gate stack of the plurality of gate stacks is formed in contact with a portion of a semiconductor fin of the plurality of semiconductor fins exposed by removing one of remaining sacrificial gate structures.

6. The method of claim 5, wherein forming each gate stack comprises:
   forming a dielectric layer over and in contact with the portion of a semiconductor fin.

7. The method of claim 5, wherein forming each gate stack further comprises:
   after forming the dielectric layer, forming a gate conductor layer over and in contact with the dielectric layer.

8. A method for forming tapered semiconductor devices, the method comprising at least:
   forming a plurality of semiconductor fins on a substrate;
   forming a plurality of sacrificial gate structures, where each sacrificial gate structure is formed over and in contact with each of the plurality of semiconductor fins;
   forming a gate cut mask over the plurality of semiconductor fins and the plurality of sacrificial gate structures, the gate cut mask being formed with one cut window exposing one or more portions of multiple sacrificial gate structures of the plurality of sacrificial gate structures; and
   removing at least the portion of multiple sacrificial gate structures, and one or more portions of each semiconductor fin of the plurality of semiconductor fins underlying the one or more portions of one of the multiple sacrificial gate structures.

9. The method of claim 8, wherein the one cut window further exposes portions of a only single semiconductor fin of the plurality of semiconductor fins adjacent to the one or more portions of the multiple sacrificial gate structures.

10. The method of claim 8, wherein the one cut window further exposes portions of multiple semiconductor fins of the plurality of semiconductor fins adjacent to the one or more portions of the multiple sacrificial gate structures.

11. The method of claim 8, wherein the gate cut mask is formed utilizing at least one of directed self-assembly or extreme ultraviolet lithography.

12. The method of claim 8, further comprising:
   forming source/drain regions in contact with portions of each fin of the plurality of semiconductor fins prior to forming the gate cut mask.

13. The method of claim 8, wherein forming the plurality of semiconductor fins comprises
   forming a first plurality of semiconductor fins in a pFET area of the substrate;
   forming a second plurality of semiconductor fins in a nFET area of the substrate, wherein forming the plurality of sacrificial gate structures comprises
   forming a first plurality of sacrificial gate structures formed over and in contact with each of the first plurality of semiconductor fins; and
   forming a second plurality of sacrificial gate structures formed over and in contact with each of the second plurality of semiconductor fins,
   where two or more of the first plurality of sacrificial gate structures are connected with two or more of the second plurality of sacrificial gate structures.

14. The method of claim 13, wherein the multiple sacrificial gate structures are from one of the first plurality of semiconductor fins, wherein the forming the gate cut mask further comprises:
   forming at least one additional cut window within the gate cut mask, wherein the at least one additional cut window exposes one or more portions of multiple sacrificial gate structures of the second plurality of sacrificial gate structures.

15. The method of claim 14, wherein the plurality of semiconductor fins underlying the one or more portions of one of the multiple sacrificial gate structures is the first plurality of semiconductor fins, wherein the method further comprises:
   removing at least the one or more portions of the multiple sacrificial gate structures of the second plurality of sacrificial gate structures, and one or more portions of each semiconductor fin of the second plurality of semiconductor fins underlying the one or more portions of one of the multiple sacrificial gate structures.

16. A semiconductor structure comprising at least:
   a substrate;
   at least one plurality of semiconductor fins formed on the substrate;
   at least one plurality of sacrificial gate structures, where each sacrificial gate structure of the at least one plurality of sacrificial gate structures is formed over and in contact with each semiconductor fin of the at least one plurality of semiconductor fins; and
   a gate cut mask formed over the at least one plurality of semiconductor fins and the at least one plurality of sacrificial gate structures, the gate cut mask comprising one cut window exposing one or more portions of multiple sacrificial gate structures of the at least one plurality of sacrificial gate structures.

17. The semiconductor structure of claim 16, further comprising:

source/drain regions in contact with portions of each fin of the at least one plurality of semiconductor fins.

18. The semiconductor structure of claim 16, wherein the one cut window further exposes portions of a single semiconductor fin of the at least one plurality of semiconductor fins adjacent to the one or more portions of the multiple sacrificial gate structures.

19. The semiconductor structure of claim 16, wherein the one cut window further exposes portions of multiple semiconductor fins of the at least one plurality of semiconductor fins adjacent to the one or more portions of the multiple sacrificial gate structures.

20. The semiconductor structure of claim 16, wherein the at least one plurality of semiconductor fins is formed in a pFET area of the substrate, and wherein the semiconductor structure further comprises:
- an additional plurality of semiconductor fins formed in a nFET area of the substrate; and
- an additional plurality of sacrificial gate structures, where each sacrificial gate structure of the additional plurality of sacrificial gate structures is formed over and in contact with each semiconductor fin of the additional plurality of semiconductor fins,
- wherein two or more of the one plurality of sacrificial gate structures are connected with two or more of the additional plurality of sacrificial gate structures, and wherein the gate cut mask further comprises
- an additional cut window, wherein the additional cut window exposes one or more portions of multiple sacrificial gate structures of the additional plurality of sacrificial gate structures.

* * * * *